(12) United States Patent
Segawa et al.

(10) Patent No.: US 11,770,940 B2
(45) Date of Patent: Sep. 26, 2023

(54) IMAGING ELEMENT, IMAGE SENSOR, AND INFORMATION PROCESSING APPARATUS

(71) Applicant: SONY INTERACTIVE ENTERTAINMENT INC., Tokyo (JP)

(72) Inventors: Hiroyuki Segawa, Yokohama (JP); Hidehiko Ogasawara, Tokyo (JP)

(73) Assignee: SONY INTERACTIVE ENTERTAINMENT INC., Tokyo (JP)

( * ) Notice: Subject to any disclaimer, the term of this patent is extended or adjusted under 35 U.S.C. 154(b) by 0 days.

(21) Appl. No.: 15/736,115

(22) PCT Filed: Jun. 24, 2016

(86) PCT No.: PCT/JP2016/068776
§ 371 (c)(1),
(2) Date: Dec. 13, 2017

(87) PCT Pub. No.: WO2017/002717
PCT Pub. Date: Jan. 5, 2017

(65) Prior Publication Data
US 2018/0213170 A1  Jul. 26, 2018

(30) Foreign Application Priority Data

Jul. 1, 2015  (JP) .................. 2015-133062

(51) Int. Cl.
  *H10K 39/32*  (2023.01)
  *H01L 27/146*  (2006.01)
  (Continued)

(52) U.S. Cl.
  CPC ............... *H10K 39/32* (2023.02); *G02B 5/30* (2013.01); *H01L 27/14* (2013.01); *H01L 27/146* (2013.01);
  (Continued)

(58) Field of Classification Search
  None
  See application file for complete search history.

(56) References Cited

U.S. PATENT DOCUMENTS 4,683,145 A * 7/1987 Nishimura ............... B05D 1/60
                                                  136/258
4,702,983 A * 10/1987 Haino .................. G03G 5/0679
                                                  430/59.2
(Continued)

FOREIGN PATENT DOCUMENTS

JP  2002-502129 T  1/2002
JP  2006-100766 A  4/2006
(Continued)

OTHER PUBLICATIONS

JP-2011176525-A machine translation (Year: 2011).*
(Continued)

*Primary Examiner* — Vincent Wall
(74) *Attorney, Agent, or Firm* — Katten Muchin Rosenman LLP

(57) ABSTRACT

In an imaging element 28, a first light detecting layer 12 includes an organic photoelectric conversion film 38 that detects light of a predetermined wavelength band and carries out photoelectric conversion, and photoelectrically converts incident light on the imaging element and light reflected from a wire grid polarizer layer 14. The wire grid polarizer layer 14 includes polarizers 48 in which linear materials that do not allow transmission of light therethrough are arranged at intervals shorter than the wavelength of the incident light. A second light detecting layer 16 includes photoelectric conversion elements 54 that photoelectrically convert light transmitted through the polarizers 48.

8 Claims, 21 Drawing Sheets

(51) Int. Cl.
- *H01L 27/14* (2006.01)
- *H04N 13/239* (2018.01)
- *G02B 5/30* (2006.01)
- *H04N 13/257* (2018.01)
- *H04N 23/10* (2023.01)
- *H04N 23/12* (2023.01)
- *H04N 23/84* (2023.01)
- *H04N 25/70* (2023.01)
- *H04N 25/13* (2023.01)
- *H10K 30/82* (2023.01)
- *H10K 30/87* (2023.01)

(52) U.S. Cl.
CPC ......... *H04N 13/239* (2018.05); *H04N 13/257* (2018.05); *H04N 23/10* (2023.01); *H04N 23/12* (2023.01); *H04N 23/843* (2023.01); *H04N 25/134* (2023.01); *H04N 25/70* (2023.01); *H10K 30/82* (2023.02); *H10K 30/87* (2023.02); *Y02E 10/549* (2013.01)

(56) References Cited

U.S. PATENT DOCUMENTS

| | | | |
|---|---|---|---|
| 4,947,034 A * | 8/1990 | Wickramasinghe ... | B82Y 35/00 250/216 |
| 5,607,568 A * | 3/1997 | Zenharusern ......... | G01Q 60/22 204/452 |
| 6,303,943 B1 | 10/2001 | Yu et al. | |
| 7,547,912 B2 | 6/2009 | Osaka et al. | |
| 7,948,514 B2 | 5/2011 | Sato et al. | |
| 9,064,763 B2 | 6/2015 | Ozawa et al. | |
| 9,349,963 B2 | 5/2016 | Murata et al. | |
| 2002/0027206 A1* | 3/2002 | Yuan .................. | H01L 27/3227 250/551 |
| 2004/0008310 A1* | 1/2004 | Leidig ............... | G02F 1/133634 349/124 |
| 2007/0007676 A1* | 1/2007 | Sato ...................... | G02F 1/035 264/1.24 |
| 2010/0282945 A1 | 11/2010 | Yokogawa | |
| 2011/0109776 A1* | 5/2011 | Kawai .............. | H01L 27/14625 348/273 |
| 2011/0139969 A1 | 6/2011 | Nii | |
| 2013/0059396 A1* | 3/2013 | LeBoeuf ................ | B82Y 30/00 436/149 |
| 2013/0293871 A1* | 11/2013 | Gruev .................. | G01J 3/0224 356/73 |
| 2015/0206912 A1 | 7/2015 | Kanamori et al. | |
| 2016/0037098 A1* | 2/2016 | Lee ........................ | H01L 27/307 257/292 |
| 2016/0163752 A1* | 6/2016 | Sambongi ......... | H01L 27/14621 348/222.1 |

FOREIGN PATENT DOCUMENTS

| | | | | |
|---|---|---|---|---|
| JP | 2007-59515 | A | | 3/2007 |
| JP | 2010-263158 | A | | 11/2010 |
| JP | 2011-103335 | A | | 5/2011 |
| JP | 2011-176525 | A | | 9/2011 |
| JP | 2011176525 | A | * | 9/2011 |
| JP | 2011-199152 | A | | 10/2011 |
| JP | 2012-080065 | A | | 4/2012 |
| JP | 2012-212978 | A | | 11/2012 |
| JP | 2013-57769 | A | | 3/2013 |
| JP | 2013-183056 | A | | 9/2013 |
| JP | 2013183056 | A | * | 9/2013 |
| JP | 2014-057231 | A | | 3/2014 |
| JP | 2015-41793 | A | | 3/2015 |
| JP | 2015041793 | A | * | 3/2015 ....... H01L 27/14621 |
| JP | 2015-95879 | A | | 5/2015 |
| TW | 201104854 | A | | 2/2011 |
| WO | 2009/147814 | A1 | | 12/2009 |
| WO | 2015/015722 | A1 | | 2/2015 |

OTHER PUBLICATIONS

JP-2013183056-A machine translation of description (Year: 2013).*
Narinder Kumar (2008). Comprehensive Physics XII. Laxmi Publications, p. 1416. ISBN 978-81-7008-592-8. (Year: 2008).*
https://en.wikipedia.org/wiki/Visible_light_communication (Year: 2022).*
Teja, Ravi, "What is a Photodiode? Working, V-I Characteristics, Applications", https://www.electronicshub.org/photodiode-working-characteristics-applications/, May 15, 2021 (Year: 2021).*
Sinha et al., "What Is A Photodiode And Where It Used?", https://www.electronicsforu.com/resources/photodiode-working-applications, Aug. 14, 2020 (Year: 2020).*
International Preliminary Report on Patentability dated Jan. 2, 2018, from the corresponding PCT/JP2016/068776.
Office Action dated May 10, 2017, from the corresponding Taiwan Patent Application No. 105119751.
International Search Report and Written Opinion dated Aug. 9, 2016, from the corresponding PCT/JP2016/068776.

* cited by examiner

FIG.8
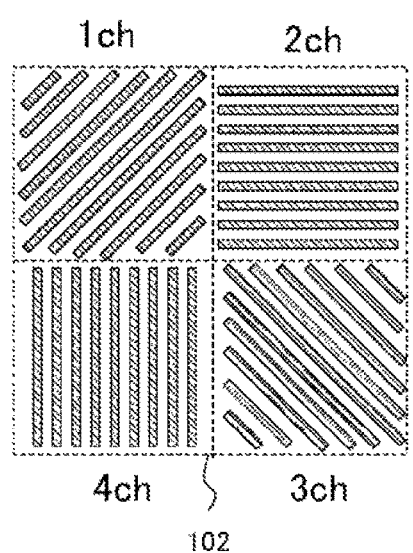
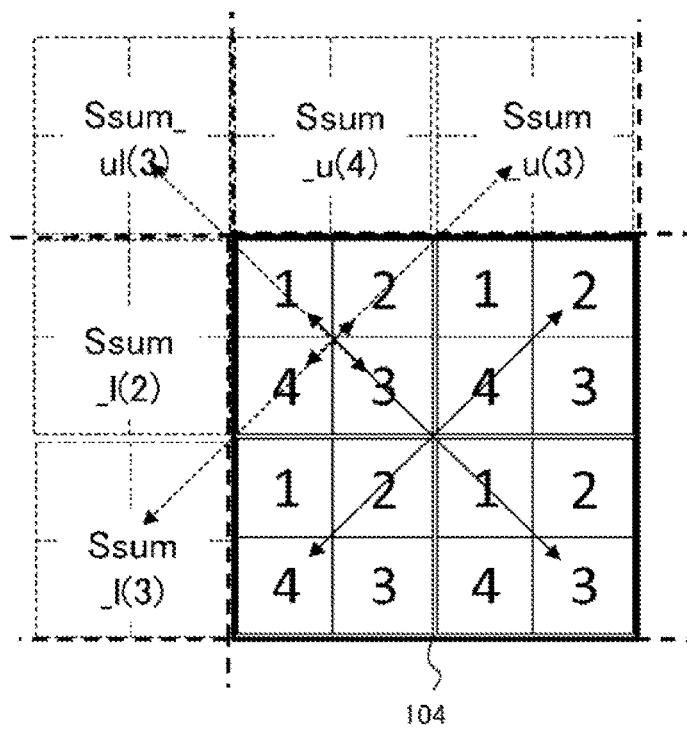

FIG.19

IMAGING ELEMENT, IMAGE SENSOR, AND INFORMATION PROCESSING APPARATUS

TECHNICAL FIELD

The present invention relates to an image data acquisition technique using an imaging element that selectively acquires an optical component.

BACKGROUND ART

Polarization cameras that are equipped with a polarization filter over a sensor and thereby acquire polarization information of a subject have been put into practical use. Using the polarization camera allows acquisition of information on the surface orientation of a subject and the existence of a transparent object and thus facilitates object identification and foreign matter detection. For this reason, application to a wide range of fields such as inspecting apparatuses in manufacturing lines and in-vehicle cameras is expected (refer to PTL 1 and PTL2, for example).

CITATION LIST

Patent Literature

[PTL 1]
JP 2012-80065A
[PTL 2]
JP 2014-57231A

SUMMARY

Technical Problems

With the polarization camera, information that can be acquired is restricted and naturally the use purpose thereof is also limited because of the principle that light that has passed through a polarization filter having the polarization axis of a predetermined direction is detected, i.e. choice of an optical component is made. On the other hand, information on the surface orientation and so forth that can be acquired by the polarization camera is useful also in various kinds of information processing that require image analysis and therefore a technique that can be easily applied to such processing is desired.

The present invention is made in view of such problems and an object thereof is to provide a technique by which a wide variety of information on a subject including polarization information can be easily acquired by photographing.

Solution to Problems

A certain aspect of the present invention relates to an imaging element. This imaging element is characterized by including a first light detecting layer including a photoelectric conversion element having optical transmittivity, a polarizer layer that exists at a lower level relative to the first light detecting layer and includes a polarizer having reflective members formed in a stripe manner, and a second light detecting layer that exists at a lower level relative to the polarizer layer and includes a photoelectric conversion element.

Another aspect of the present invention relates to an image sensor. This image sensor is characterized by including a pixel unit in which the imaging elements having the above-described characteristics are disposed in a matrix manner and a control unit that drives the imaging elements forming the pixel unit in predetermined order to acquire electrical signals and sequentially output the electrical signals.

Further another aspect of the present invention relates to an information processing apparatus. This information processing apparatus is characterized by including the image sensor having the above-described characteristics, a memory that stores data of a plurality of kinds of images generated based on electrical signals output from this image sensor, and an output data generating unit that executes information processing with use of the data of the images stored in the memory and generates output data that represents a result thereof.

What are obtained by translating arbitrary combinations of the above constituent elements and expressions of the present invention among method, apparatus, and so forth are also effective as aspects of the present invention.

Advantageous Effect of Invention

According to the present invention, a wide variety of information on a subject including polarization information can be easily acquired by photographing.

BRIEF DESCRIPTION OF DRAWINGS

FIG. 8 is a diagram for explaining processing of defect detection and correction of a polarization component executed by a defect detecting unit and a defect correcting unit in the present embodiment.

FIG. 19 is a diagram exemplifying the relation between the unit pixel arrays of the first light detecting layer and the second light detecting layer depicted in FIG. 18 and the regions of the polarizers of the respective channels in the wire grid polarizer layer.

DESCRIPTION OF EMBODIMENT

Figure 1:
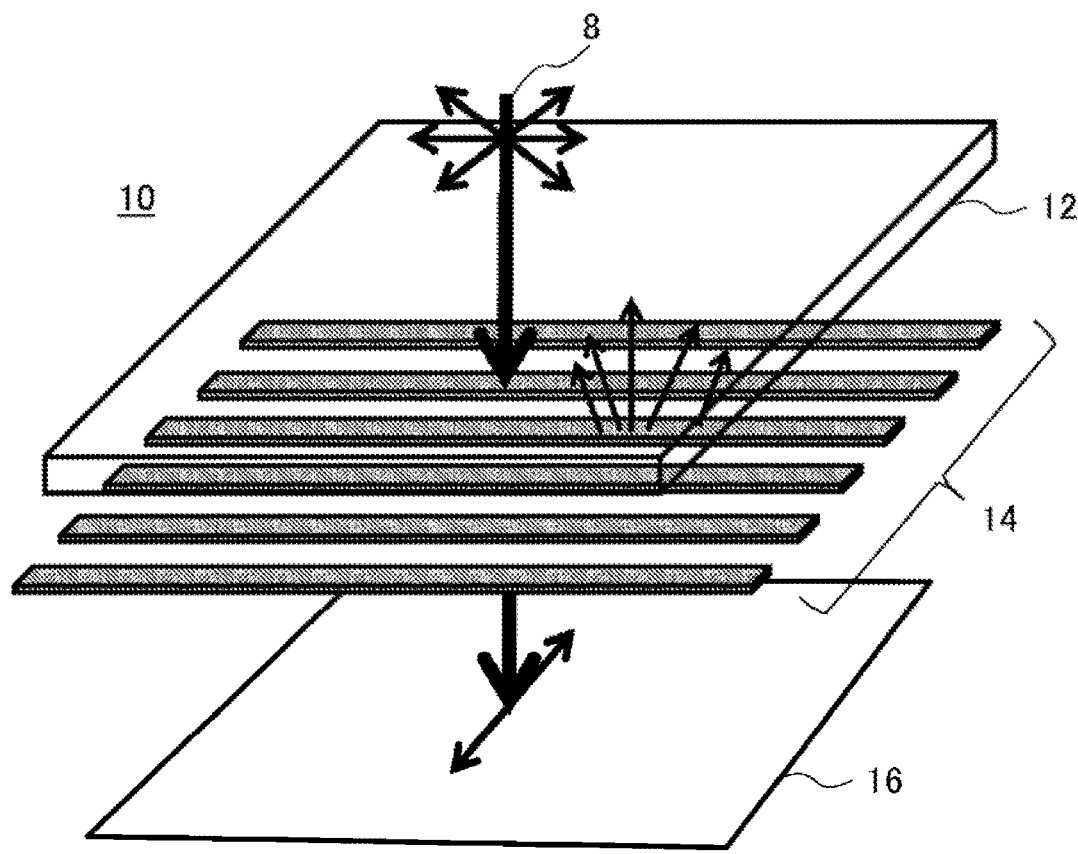
FIG. 1 is a conceptual diagram of an imaging element in the present embodiment.

FIG. 1 is a conceptual diagram of an imaging element in the present embodiment. An imaging element 10 includes a first light detecting layer 12, a wire grid polarizer layer 14, and a second light detecting layer 16. The first light detecting layer 12 includes an organic photoelectric conversion material and transparent electrodes formed to sandwich it, and has a structure that absorbs part of light to generate a charge and allows transmission of the remaining light therethrough. The wire grid polarizer layer 14 includes a polarizer obtained by arranging plural linear conductor members in a stripe manner at intervals shorter than the wavelength of incident light 8. The second light detecting layer 16 has a semiconductor element structure of a general charge coupled device (CCD) image sensor, complementary metal oxide semiconductor (CMOS) image sensor, or the like.

First, part of the incident light 8 from the side of the first light detecting layer 12 is absorbed by the first light detecting layer 12 and is photoelectrically converted and the remaining light is transmitted. When the transmitted light is incident on the wire grid polarizer layer 14, the polarization component with the orientation parallel to the line of the polarizer is reflected and only the perpendicular polarization component is transmitted. The polarization component transmitted in this manner is detected by the second light detecting layer 16. On the other hand, the component reflected by the wire grid polarizer layer 14 is incident on the first light detecting layer 12 again and part thereof is absorbed and photoelectrically converted. Due to such a configuration, two kinds of light can be detected at the same place, i.e. substantially-unpolarized light can be detected by the first light detecting layer 12 and the polarization component with the specific orientation can be detected by the second light detecting layer 16.

Figure 2:
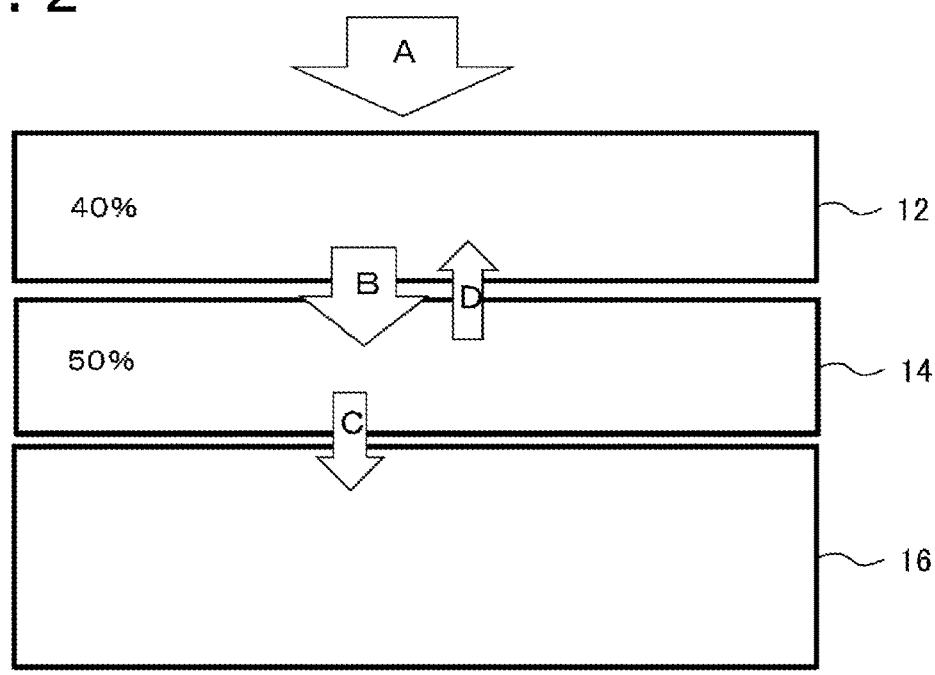
FIG. 2 is a diagram for explaining the detection efficiency of incident light in the imaging element with the structure depicted in FIG. 1.

Furthermore, because the reflected light of the wire grid polarizer layer 14 is absorbed by the first light detecting layer 12, the imaging element 10 is excellent in the detection efficiency of the incident light. FIG. 2 is a diagram for explaining the detection efficiency of the incident light in the imaging element with the structure depicted in FIG. 1. First, assuming that the absorptance of incident light (arrow A) in the first light detecting layer 12 is 40%, the remaining 60% is incident on the wire grid polarizer layer 14 (arrow B). Assuming that the transmittance in the wire grid polarizer layer 14 is 50%, light incident on the second light detecting layer 16 and reflected light are both 60% of initial incident light×50%=30% (arrows C and D).

In them, the reflected light (arrow D) is absorbed by the first light detecting layer 12 at 30%×40%=12%. As a result, 40%+12%=52% is absorbed in the first light detecting layer 12. That is, according to the structure of this imaging element, 52% in the first light detecting layer 12 and 30% in the second light detecting layer 16, i.e. total 82%, becomes the detection target. Here, if a contrivance is made about the structure of the first light detecting layer 12 so that the reflected light by the wire grid polarizer layer 14 may be collected more readily as described later and the occurrence of stray light is suppressed to approximately ¹⁄₁₀, the incident light can be reflected in the detection value at a ratio close to 100%.

If the transmittance in the wire grid polarizer layer 14 is adjusted based on the coverage rate of the conductor that forms the polarizer and is set to 70%, for example, 47% or higher becomes the detection target in the first light detecting layer and 42% becomes the detection target in the second light detecting layer. So, the detection efficiency can be further increased even with the same structure as the above-described structure. As described above, the imaging element of the present embodiment can obtain information on polarized light/unpolarized light at the same position. However, if plural polarizers having different principal axis angles (directions of the stripe) are disposed close to each other, information on polarization components with plural orientations can be further acquired at almost the same position.

Figure 3:
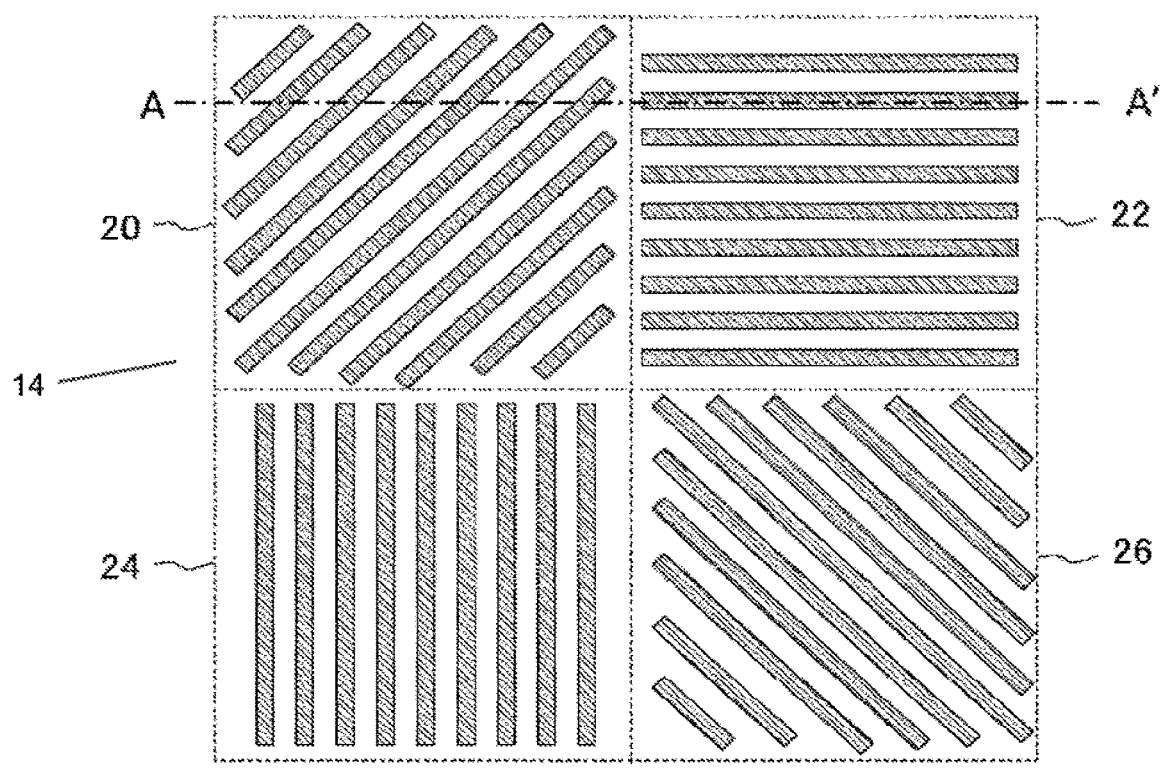
FIG. 3 is a diagram depicting an example of layout when plural polarizers different in the principal axis angle are disposed close to each other in a wire grid polarizer layer in the present embodiment.

FIG. 3 depicts an example of layout when plural polarizers different in the principal axis angle are disposed close to each other in the wire grid polarizer layer 14. This diagram depicts the state in which the wire grid polarizer layer 14 is viewed from above, and hatched lines are conductors (wires) that form the polarizers. Dotted-line rectangles each represent the region of a polarizer with one principal axis angle and the dotted lines themselves are not actually formed. In the example depicted in the diagram, four polarizers different in the principal axis angle are disposed in a respective one of four regions 20, 22, 24, and 26 on two rows and two columns.

In the diagram, the principal axis angles of polarizers that exist on a diagonal are orthogonal and polarizers adjacent to each other have a difference of 45°. That is, polarizers with four principal axis angles at every 45° are provided. Each polarizer attenuates the polarization component in the direction of the wire and allows transmission of the polarization component in the direction orthogonal to it therethrough. Due to this, in the second light detecting layer 16 provided thereunder, polarization information of four orientations at every 45° can be obtained in the respective regions corresponding to the four regions 20, 22, 24, and 26 of the wire grid polarizer layer 14.

If a predetermined number of such polarizer arrangements with the four principal axis angles are further arranged in the vertical direction and the horizontal direction and light is detected by the upper and lower layers with associating of the unit of each polarizer or a unit smaller than it with a pixel, an image of substantially-non-polarization and images of four kinds of polarization components are obtained. Hereinafter, description will be made in such a manner that the polarizer arrangement with the four principal axis angles depicted in FIG. 3 is deemed as one unit.

Figure 4:
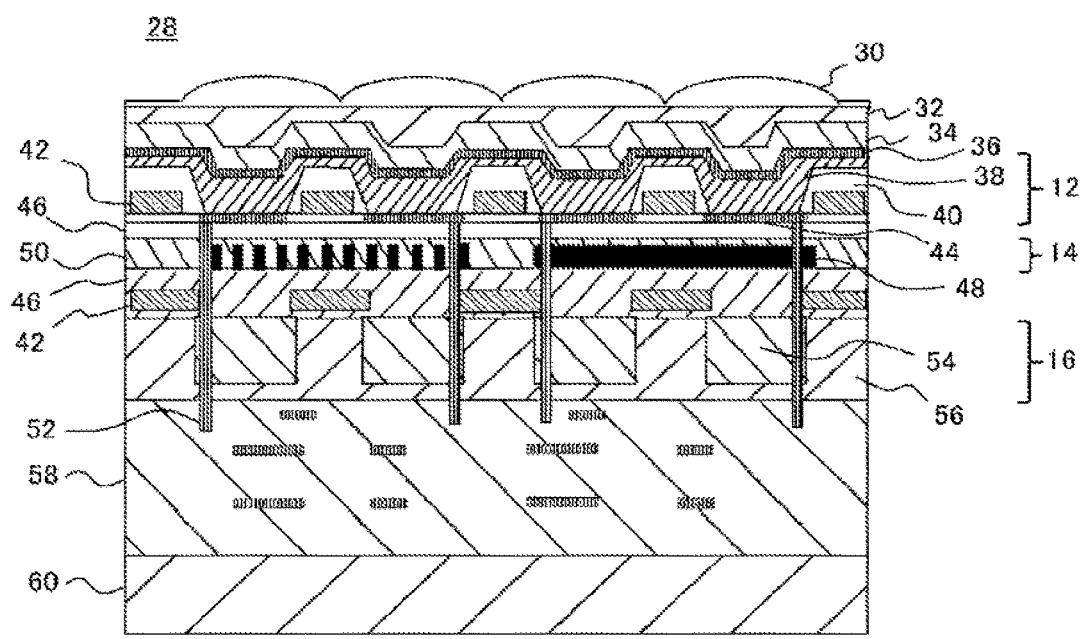
FIG. 4 is a sectional view depicting a structure example of the imaging element of the present embodiment.

FIG. 4 represents a structure example of the imaging element of the present embodiment by a sectional view. This imaging element 28 acquires a black-and-white (grayscale) image as polarization information. The imaging element 28 has a structure in which the second light detecting layer 16, the wire grid polarizer layer 14, the first light detecting layer 12, and on-chip lenses 30 are stacked in that order over a multilayer interconnect layer 58 for transferring a detection result as an electrical signal and sticking a support substrate 60 to the back. The first light detecting layer 12 includes an organic photoelectric conversion film 38 that selectively detects light of a predetermined wavelength band and carries out photoelectric conversion, an upper electrode 36 and lower electrodes 44 for applying a voltage to it and extracting a signal charge, and an inorganic insulating film 40.

The lower electrodes 44 are formed for each of the regions corresponding to the pixels and are insulated from each other by the inorganic insulating film 40. In order to read out a charge generated through photoelectric conversion by the organic photoelectric conversion film 38, electrically-conductive plugs 52 that lead to the multilayer interconnect layer 58 are connected to the lower electrodes 44. A charge that has moved through the electrically-conductive plug 52 is accumulated in a charge accumulating layer, which is not depicted in the diagram, and is read out at a predetermined timing. The upper electrode 36 is connected to the multilayer interconnect layer 58 by a contact metal layer, which is not depicted in the diagram, and a voltage is applied thereto. The organic photoelectric conversion film 38 absorbs light of the predetermined wavelength region at a predetermined ratio to carry out photoelectric conversion, whereas the organic photoelectric conversion film 38 allows transmission of the remaining light therethrough. The organic photoelectric conversion film 38 includes a quinacridone derivative, a naphthalene derivative, an anthracene derivative, or a conjugated polymer, for example.

The upper electrode 36 and the lower electrodes 44 include an inorganic electrically-conductive film having optical transmittivity, e.g. indium tin oxide (ITO) or tin oxide (TO). The inorganic insulating film 40 is a film obtained by forming a material such as silicon oxide, silicon nitride, or silicon oxynitride (SiON), for example, in a lattice manner among the lower electrodes 44 corresponding to the pixels and the organic photoelectric conversion film 38 thereon. Light blocking layers 42 are formed inside the inorganic insulating film 40. As depicted in the diagram, the organic photoelectric conversion film 38 is in contact with the lower electrodes 44 with such a shape as to sink among the light blocking layers 42 and has a well-type shape having a recess with the upper electrode 36 in the opposed region.

By employing such a shape, light reflected from the wire grid polarizer layer 14 can be efficiently collected and stray light can be reduced as described above. The light blocking layers 42 suppress incidence of light from the lateral direction. For the light blocking layers 42, a material with a low transmittance with respect to visible light, such as tungsten, titanium, aluminum, or copper, or a nitride film thereof is used, for example. Over such a first light detecting layer 12, the on-chip lenses 30 are provided with the intermediary of a protective film 34 and a planarizing layer 32. The protective film 34 includes an inorganic material having optical transmittivity, such as silicon oxide, silicon nitride, or silicon oxynitride, for example.

The planarizing layer 32 includes a resin having optical transmittivity, such as an acrylic resin, a styrene resin, or an epoxy resin, for example. However, the protective film 34 may double as the planarizing layer 32. The on-chip lenses 30 cause incident light to be focused on the respective pixel regions of the first light detecting layer 12. Techniques for acquiring an image by using an organic photoelectric conversion film are disclosed in JP 2002-502129T, JP 2011-199152A, JP 2013-183056A, JP 2007-59515A, and so forth, for example. However, in the present embodiment, a material having an absorption wavelength band including all wavelength bands of red, green, and blue may be selected.

That is, it suffices that information on the luminance be obtained by using a material that absorbs a wider wavelength band of visible light or stacking materials of different absorption wavelength bands. Such materials and structures have been put into practical use also in the field of photovoltaic generation and so forth particularly and techniques in which the absorption wavelength band is controlled based on the material are publicly known also in the above-described documents and so forth. For example, as materials that absorb light of a wide wavelength band of visible light, polymers such as polythienylenevinylene (PTV) and polyvinylcarbazole (PVK) disclosed in JP 2002-502129T, materials obtained by mixing them with organic molecules, and so forth can be used. Furthermore, the absorptance of light in this film is controlled as appropriate based on the thickness of the formed film as disclosed in JP 2007-59515A, for example.

Under the first light detecting layer 12, the wire grid polarizer layer 14 is provided with the intermediary of an interlayer insulating film 46. The interlayer insulating film 46 includes silicon oxide, silicon nitride, or silicon oxynitride. The wire grid polarizer layer 14 has a structure in which polarizers 48 are buried in an interlayer film 50 having optical transmittivity, such as silicon oxide or an acrylic resin. The polarizer 48 has a stripe-shaped arrangement whose direction differs depending on the region when being viewed from the upper surface as depicted in FIG. 3. FIG. 4 depicts a section along one-dot chain line A-A' in FIG. 3, for example. As depicted by blacked-out areas, plural wire sections are viewed in the left region of the diagram and a side surface of one wire is viewed in the right region.

The polarizer 48 is formed by arranging linear aluminum with a thickness of 100 nm and a width of 50 nm at intervals of 150 nm, for example. By forming the polarizer 48 by arranging linear materials that do not allow transmission of light therethrough at intervals shorter than the wavelength of incident light in this manner, the polarization component in the direction orthogonal to the polarizer 48 is transmitted. Furthermore, light reflected by the polarizer 48 is incident on the first light detecting layer 12. Under the wire grid polarizer layer 14, the second light detecting layer 16 is provided with the intermediary of the interlayer insulating film 46 of a material similar to the above-described material. Here, the interlayer insulating film 46 includes the light blocking layers 42, which suppresses incidence of light on the second light detecting layer 16 from the lateral direction.

The second light detecting layer 16 has a structure in which photoelectric conversion elements 54 are buried in a silicon substrate 56 corresponding to the respective pixels. In this diagram, for the polarizer 48 with one principal axis angle, two lower electrodes 44 corresponding to pixels of the first light detecting layer 12 and two photoelectric conversion elements 54 corresponding to pixels of the second light detecting layer 16 are provided in the lateral direction. If two lower electrodes 44 and two photoelectric conversion elements 54 are provided also in the depth direction of the diagram similarly, four pixels of the first light detecting layer 12 and four pixels of the second light detecting layer 16 are provided for the polarizer 48 with one principal axis angle.

However, the region of one pixel of the first light detecting layer 12 and the region of one pixel of the second light detecting layer 16 may be different in the area. Furthermore, in the case of acquiring a color image as polarization information, a color filter is provided over the second light detecting layer 16 and photoelectric conversion elements are provided for each color as described later. By arranging the imaging elements 28 like those depicted in the diagram in a matrix manner in the lateral direction and depth direction of the diagram and connecting a peripheral circuit that controls the timing of light detection, an image sensor that simultaneously acquires information on plural kinds of light as two-dimensional data can be configured. Techniques in which an image is acquired by using a wire grid polarizer are disclosed in JP 2012-80065A, for example.

Figure 5:
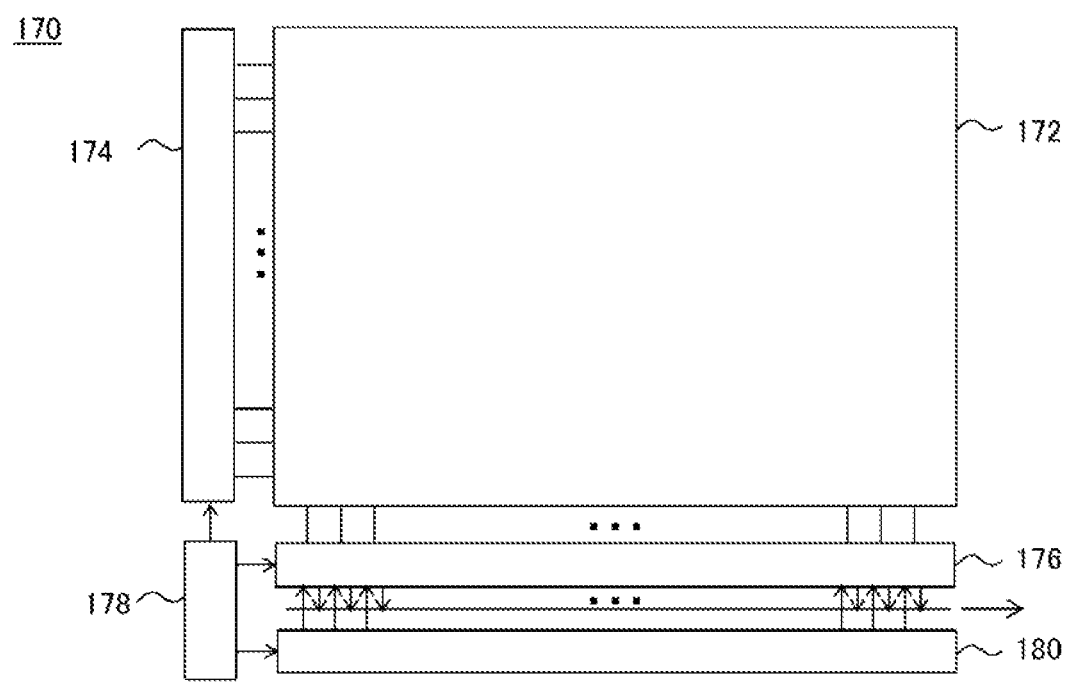
FIG. 5 is a diagram depicting the outline of the structure of an image sensor in the present embodiment.

The configuration of the peripheral circuit for reading out a charge may be similar to that of a general image sensor. However, two similar peripheral circuits are provided in order to concurrently read out two images, an image having detection values of the first light detecting layer 12 as the pixel values and an image having detection values of the second light detecting layer 16 as the pixel values. FIG. 5 depicts the outline of the structure of an image sensor in the present embodiment. An image sensor 170 includes a pixel unit 172 and a row scanning unit 174, a horizontal selection unit 176, a column scanning unit 180, and a control unit 178 as the peripheral circuit. The pixel unit 172 is obtained by arranging the imaging elements 28 of one unit like that depicted in FIG. 4 in a matrix manner.

In the present embodiment, a charge that represents the total of incident light from the subject space and reflected light from the wire grid polarizer layer 14 and a charge that represents the polarization components with the respective orientations are read out from the first light detecting layer 12 and the second light detecting layer 16, respectively, in units of the electrode corresponding to the pixel. In this diagram, one of the two peripheral circuits for the reading is depicted as the representative. The respective pixels including an existing mechanism such as transistors for reading out the charge that is generated by photoelectric conversion and is accumulated in the charge accumulating layer are connected to the row scanning unit 174 on each row basis and are connected to the horizontal selection unit 176 and the column scanning unit 180 on each column basis. The row scanning unit 174 includes a shift register, an address code, and so forth and drives the respective pixels in units of a row.

Signals output from the pixels selectively scanned by the row scanning unit 174 are supplied to the horizontal selection unit 176. The horizontal selection unit 176 includes an amplifier, horizontal selection switches, and so forth. The column scanning unit 180 includes a shift register, an address decoder, and so forth and sequentially carries out driving while operating the respective horizontal selection switches of the horizontal selection unit 176. By the selective scanning by the column scanning unit 180, the signals from the respective pixels supplied to the horizontal selection unit 176 are output to the external. The control unit 178 generates timing signals and controls the driving timings of the horizontal selection unit 176, the column scanning unit 180, and so forth.

By providing peripheral circuits like that depicted in the diagram as two peripheral circuits for signal reading from the first light detecting layer 12 and for signal reading from the second light detecting layer 16, the output frame rates of two kinds of images based on them can be independently controlled. For example, the frame rate of the image from the first light detecting layer 12 is set lower than the frame rate of the image from the second light detecting layer 16. Specifically, when the latter is set to 60 fps, the former is set to 30 fps or the like. This can extend the accumulation time of a charge generated by the first light detecting layer 12 compared with the second light detecting layer 16 and improve the sensitivity of the first light detecting layer 12.

As described above, the ratio of light transmitted from the first light detecting layer 12 to the side of the second light detecting layer 16 is controlled by adjusting the film thickness of the organic photoelectric conversion film 38. If the film thickness of the organic photoelectric conversion film 38 is set small in order to sufficiently ensure this transmittance, naturally the detection sensitivity in the first light detecting layer 12 decreases. By properly controlling the frame rate of the image from the first light detecting layer 12 independently of the second light detecting layer 16 and according to the film thickness and material of the organic photoelectric conversion film 38, a balance can be achieved between the optical transmittance and the detection sensitivity in the first light detecting layer 12.

Furthermore, in the present embodiment, the first light detecting layer 12 has a long interlayer distance to the multilayer interconnect layer 58 for signal reading and thus involves strict limitation on the operation speed compared with the second light detecting layer 16. Also in this viewpoint, by independently controlling the frame rates of images from both, a mode in which the image from the first light detecting layer 12 is output without hardship while the output rate of the image from the second light detecting layer 16 is sufficiently ensured can be implemented. This is particularly effective in the case of constructing an image processing system in combination with an imaging apparatus of a general color image as described later.

Figure 6:
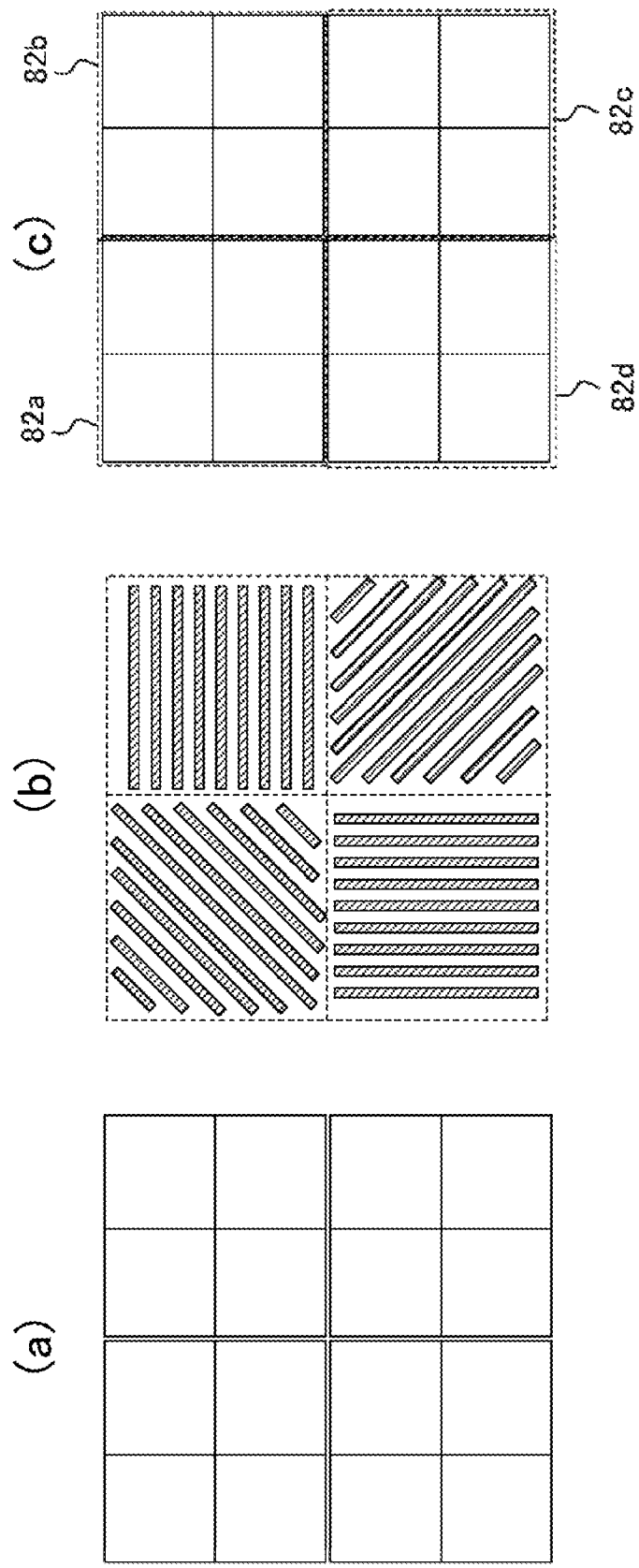
FIG. 6 is a diagram exemplifying the relation between unit pixel arrays of a first light detecting layer and a second light detecting layer and the regions of the polarizers with the respective principal axis angles in the wire grid polarizer layer in the imaging element of one unit in the present embodiment.

FIG. 6 exemplifies the relation between unit pixel arrays of the first light detecting layer 12 and the second light detecting layer 16 and the regions of the polarizers with the respective principal axis angles in the wire grid polarizer layer 14 in the imaging element of one unit described thus far. (a) of this diagram is the unit pixel array of the first light detecting layer 12. (b) is the arrangement of the polarizers with the respective principal axis angles in the wire grid polarizer layer 14. (c) is the unit pixel array of the second light detecting layer 16. In this example, as described above, four pixels on two rows and two columns are provided for the polarizer of each principal axis angle in both the first light detecting layer 12 and the second light detecting layer 16.

The first light detecting layer 12 detects light of the substantially-unpolarized component. If a material or structure that absorbs light of a wider wavelength band is used as described above here, an image close to a general luminance image is obtained by the all-pixel arrangement obtained by further arranging the unit pixel arrays of (a). The second light detecting layer 16 detects polarized light transmitted through the polarizer. Thus, information on different polarization components is obtained depending on the principal axis angles of the polarizers in the corresponding regions. Specifically, polarization components with different orientations are detected in pixel blocks 82a, 82b, 82c, and 82d each having four pixels in the unit pixel array of (c). As a result, by the all-pixel arrangement obtained by further arranging the unit pixel arrays of (c), an image in which black-and-white images of the different polarization components alternately appear in units of a pixel block is obtained.

Figure 7:
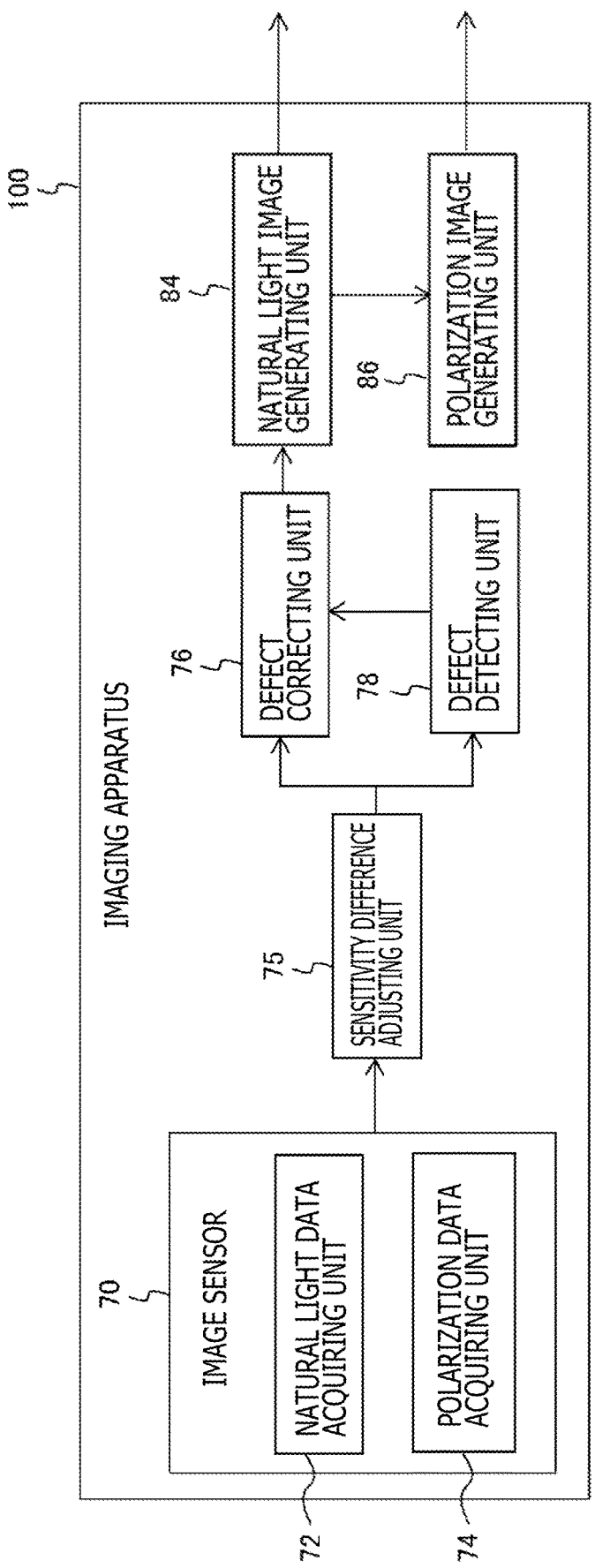
FIG. 7 is a diagram depicting functional blocks of an imaging apparatus in the present embodiment.

FIG. 7 depicts functional blocks of an imaging apparatus of the present embodiment including the above-described image sensor 70. The respective functional blocks depicted in FIG. 7 and FIGS. 20, 23, 24, and 26 to be described later can be implemented by configurations such as imaging element, various kinds of arithmetic circuits, microprocessor, central processing unit (CPU), and memory in terms of hardware and can be implemented by a program that is stored in a memory or is read out from a recording medium to the memory in terms of software. Therefore, it is understood by those skilled in the art that these functional blocks can be implemented in various forms by only hardware, only software, or a combination of them, and they are not limited to either one.

An imaging apparatus 100 includes an image sensor 70 including a matrix of pixels, a sensitivity difference adjusting unit 75 that adjusts data based on the difference in the sensitivity between the respective light detecting layers, a defect detecting unit 78 that detects a defect in data, a defect correcting unit 76 that supplements data if a defect exists, a natural light image generating unit 84 that generates a natural light image, and a polarization image generating unit 86 that generates a polarization component image. The image sensor 70 corresponds to the image sensor 170 of FIG. 5 and includes a two-dimensional arrangement of imaging elements of one unit like that depicted in FIG. 4 and a peripheral circuit. The first light detecting layer 12 and the second light detecting layer 16 are included in the imaging element of one unit as described above. Information on substantially-unpolarized light (hereinafter, referred to as "natural light") is obtained from the former and information on polarization components with plural orientations is obtained from the latter.

A natural light data acquiring unit 72 and a polarization data acquiring unit 74 in the image sensor 70 of FIG. 7 output values detected by the first light detecting layer 12 and the second light detecting layer 16, respectively, to the sensitivity difference adjusting unit 75 in predetermined pixel order such as the raster order, for example. The first light detecting layer 12 and the second light detecting layer 16 are different in the material and the structure. Thus, the possibility that the scales of the detection value are different due to the difference in the sensitivity even with the same intensity of light is high. Therefore, the sensitivity difference adjusting unit 75 aligns the scales so that comparison and addition of both can be correctly carried out in processing at subsequent stages.

Specifically, by multiplying a detection value O(x, y) of the natural light by a coefficient k(x, y), a converted value Ocon(x, y) of the natural light whose scale is adjusted to the detection value of the polarization component is calculated as follows.

$$O\mathrm{con}(x,y) = k(x,y) \times O(x,y)$$

Here, (x, y) is the coordinates of the pixel in the two-dimensional arrangement. As the coefficient k(x, y), a default value is decided as follows before operation of the imaging apparatus 100 or by initial calibration. First, a gray subject that occupies the whole of the field of view is photographed in the state in which the subject is evenly irradiated with light by an unpolarized light source. Then, the coefficient k(x, y) is decided in such a manner that the converted value of the data of the natural light at the time corresponds with the detection value of the second light detecting layer 16.

Specifically, assuming that a detection value Oin(x, y) of the natural light by the first light detecting layer 12 and a detection value Sin(x, y) of the polarization component by the second light detecting layer 16 are obtained at this time, k(x, y) is calculated to satisfy the following expression.

$$S\mathrm{in}(x,y) = k(x,y) \times O\mathrm{in}(x,y)$$

Here, if the coefficient k(x, y) exists in a predetermined range in the whole image, a constant that does not depend on the position coordinate of the pixel may be employed as the coefficient k. For example, the constant k may be decided by dividing the total sum of the detection values Sin(x, y) of the polarization components in the whole image by the total sum of the detection values Oin(x, y) of the natural light in the whole image.

The sensitivity difference adjusting unit 75 multiplies the detection values of the natural light output from the natural light data acquiring unit 72 of the image sensor 70 by the coefficient k set in this manner and thereby aligns the scale thereof to the detection values of the polarization component. Thereafter, the sensitivity difference adjusting unit 75 outputs both to the defect detecting unit 78 and the defect correcting unit 76. If a defect (abnormal value) exists in the detection values, the defect detecting unit 78 detects it. For example, in data of the polarization component, the sum of two kinds of polarization components whose orientations are orthogonal represents the original natural light. Therefore, among the detection values of the polarization components of the four orientations obtained from the unit pixel array depicted in (c) of FIG. 6, the detection values of two pairs of orthogonal polarization components are added to each other, and the sums are compared with each other. Originally both indicate equivalent values that represent the natural light. Thus, if the difference is large, it can be determined that a defect exists in any detection value.

Also regarding data of the natural light, based on the fact that originally the detection values are equivalent at close positions, a defect can be detected based on a similar criterion by adding the values of pixel blocks that exist on a diagonal in the unit pixel array to each other and comparing the sums with each other. If the defect detecting unit 78 detects a defect, the defect correcting unit 76 compensates for the defect based on data of peripheral pixels. At this time, the cause of the defect is estimated by utilizing data of the natural light at the same position regarding data of the polarization component and utilizing data of the polarization component at the same position regarding data of the natural light, and proper compensation processing is executed.

On the other hand, if the defect detecting unit 78 does not detect a defect, the defect correcting unit 76 outputs the pieces of data of the natural light and the polarization components acquired from the sensitivity difference adjusting unit 75 to the natural light image generating unit 84 as they are. The natural light image generating unit 84 generates a luminance image of the natural light that should be output finally based on the converted values of the natural light and the detection values of the polarization components. Basically, by adding the converted value obtained by multiplying the detection value of the natural light by the above-described coefficient k and the detection value of the polarization component to each other, the original incident light intensity is restored. However, the data may be further adjusted in consideration of the position dependency of the data of the natural light. A concrete method will be described later.

The natural light image generating unit 84 outputs data of the generated image of the natural light to a storing apparatus connected to the imaging apparatus 100, an image processing apparatus, and so forth as appropriate. Furthermore, the natural light image generating unit 84 outputs the detection values of the polarization components acquired from the defect correcting unit 76 and the data of the generated luminance image of the natural light to the polarization image generating unit 86. The polarization image generating unit 86 generates polarization images of the respective orientations to be output finally by using these pieces of data.

Specifically, detection values of the polarization components of the respective orientations discretely obtained depending on the placement of the polarizers are interpolated. At this time, by adding a high-frequency component of the luminance image of the natural light, details of an image represented by the high-frequency component are also restored. The polarization image generating unit 86 outputs data of the generated polarization images to the storing apparatus connected to the imaging apparatus 100 and the image processing apparatus as appropriate.

FIG. 8 is a diagram for explaining processing of defect detection and correction of data executed by the defect detecting unit 78 and the defect correcting unit 76. The left of this diagram is a unit polarizer array 102 of the wire grid polarizer layer 14 included in the imaging element of one unit and the right of this diagram is a unit pixel array 104 of the second light detecting layer 16 that detects polarization components. Regarding the unit pixel array 104, peripheral pixels thereof are also depicted by dotted lines for explanation to be described later.

Here, the polarization component by the upper left polarizer having a tilt of 45° from the vertical axis of the diagram in the unit polarizer array 102 will be referred to as 1-channel (1ch). The polarization component by the upper right polarizer having a tilt of 90° will be referred to as 2-channel (2ch). The polarization component by the lower right polarizer having a tilt of 135° will be referred to as 3-channel (3ch). The polarization component by the lower left polarizer having a tilt of 180° will be referred to as 4-channel (4ch). In the case of the unit pixel array 104 depicted in the diagram, the polarization component is detected by four pixels on two rows and two columns regarding each channel.

In the following description, the pixels of each channel are given identification numbers of 1, 2, 3, and 4 from the upper left in a clockwise manner and the 16 pixels included in the unit pixel array 104 are identified based on expression of (channel number, identification number). When attention is paid to the fact that the sum of orthogonal polarization components represents the original natural light as described above, the sum of the detection values of 1-channel and 3-channel, whose orientations are orthogonal, indicates a value equivalent to the sum of the detection values of 2-channel and 4-channel. Therefore, both are compared and it is determined that a defect exists if the difference is large.

First, the detection value of the polarization component of each pixel is defined as S(channel number, identification number) and the totals Ssum(channel number) of the detection values of the respective channels are calculated as follows.

$$Ssum(1)=S(1,1)+S(1,2)+S(1,3)+S(1,4)$$

$$Ssum(2)=S(2,1)+S(2,2)+S(2,3)+S(2,4)$$

$$Ssum(3)=S(3,1)+S(3,2)+S(3,3)+S(3,4)$$

$$Ssum(4)=S(4,1)+S(4,2)+S(4,3)+S(4,4)$$

Then, if the difference ΔS between the total sum Ssum(1)+Ssum(3) of the detection values of polarization components of channels whose orientations are orthogonal and Ssum(2)+Ssum(4), depicted by solid arrows in this diagram, surpasses a predetermined threshold, the defect detecting unit 78 determines that a defect exists in any channel. In the case of data of the natural light, the channel dependency is comparatively small because the contribution of polarization components reflected from the polarizers to the whole is small. However, considering that originally the value does not greatly change at close positions, a defect can be determined by calculation similar to that for the detection value of the polarization component. In the following description, the region corresponding to a respective one of channels will be referred to as "channel" also regarding data of the natural light.

When the total of the converted values of the natural light in four pixels of the pixel block corresponding to a respective one of channels is defined as Osum(channel number), the defect detecting unit 78 determines that a defect exists in any channel if the difference ΔO between the total sum Osum(1)+Osum(3) of the converted values of the natural light of pixel blocks that exist on a diagonal and Osum(2)+Osum(4) surpasses a predetermined threshold.

Figure 9:
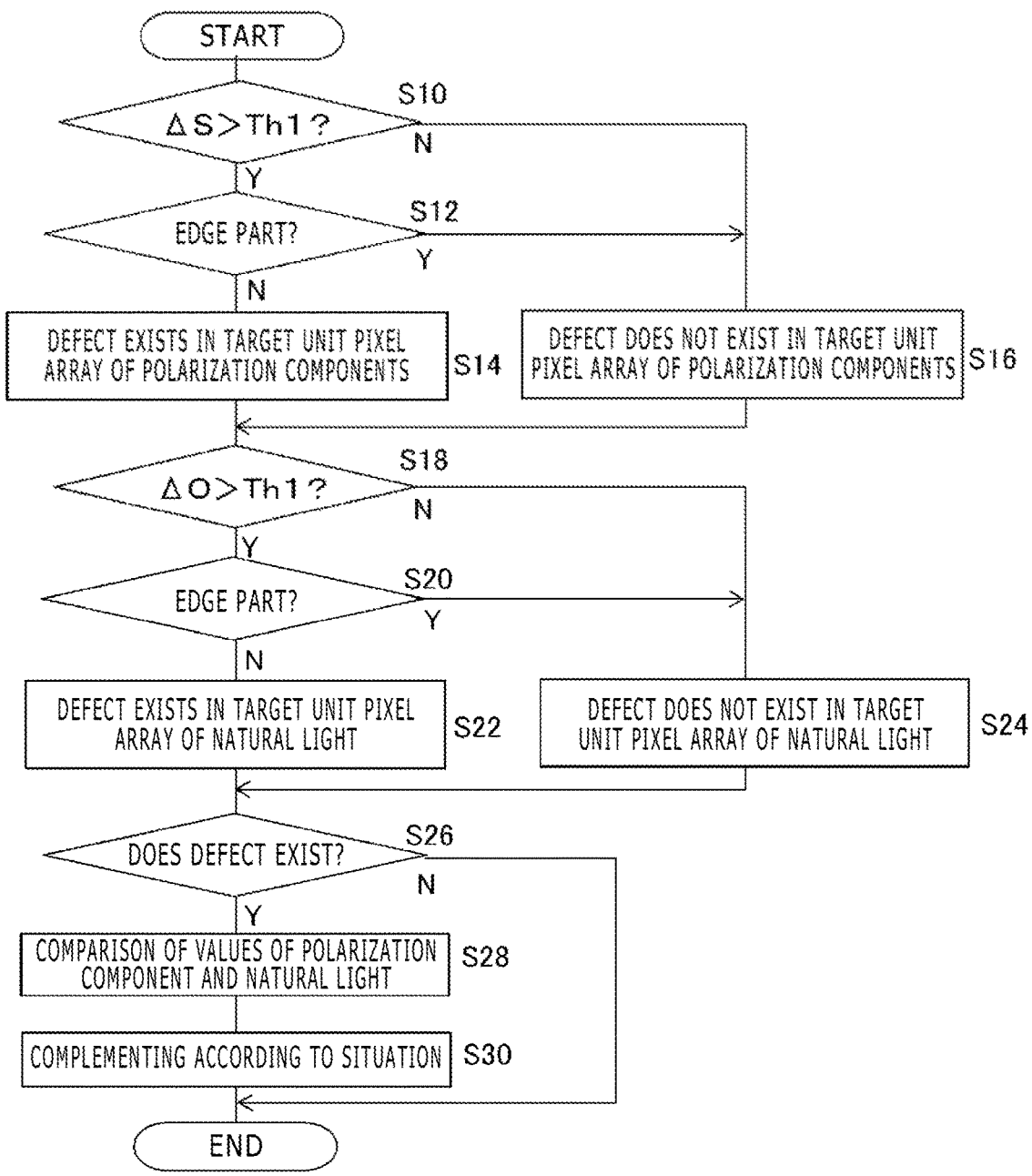
FIG. 9 is a flowchart depicting, in more detail, the processing procedure of defect detection and complementing carried out by the defect detecting unit and the defect correcting unit in the present embodiment.

According to this, when N is deemed as the channel number, the defect correcting unit 76 checks the total Ssum(N) of the detection values of the polarization component regarding each channel and the total Osum(N) of the converted values of the natural light regarding each channel and identifies the channel involving the defect in the data regarding which it is determined that the defect exists. In addition, the defect correcting unit 76 decides a value that complements it. FIG. 9 is a flowchart depicting, in more detail, the processing procedure of defect detection and complementing carried out by the defect detecting unit 78 and the defect correcting unit 76. The processing of this diagram is executed for each unit pixel array depicted in FIG. 8. First, the defect correcting unit 76 checks whether or not the above-described ΔS surpasses a threshold Th1, and determines that a defect does not exist in the relevant unit pixel array regarding the polarization components if ΔS does not surpass the threshold Th1 (N of S10, S16).

Even if ΔS surpasses the threshold (Y of S10), it is determined that a defect does not exist if the relevant unit pixel array includes an edge part as an image (Y of S12, S16). This is because qualitatively the pixel value suddenly changes at the edge part that represents a contour of the image of a subject or the like and thus possibly ΔS becomes large partly. For this determination, the defect correcting unit 76 detects an edge by a general method regarding the two-dimensional arrangement of the detection value of the polarization component. If ΔS surpasses the threshold (Y of S10) and the relevant unit pixel array does not include an edge part (N of S12), the defect detecting unit 78 determines that a defect exists in the unit pixel array regarding the polarization component (S14).

A similar determination is carried out also regarding the converted value of the natural light. Specifically, it is checked whether or not the above-described ΔO surpasses the threshold Th1, and it is determined that a defect does not exist in the relevant unit pixel array regarding the natural light if ΔO does not surpass the threshold Th1 (N of S18, S24). Even if ΔO surpasses the threshold (Y of S18), it is determined that a defect does not exist if the relevant unit pixel array includes an edge part as an image (Y of S20, S24). For this determination, the defect correcting unit 76 detects an edge also regarding the two-dimensional arrangement of the converted value of the natural light. If ΔO surpasses the threshold (Y of S18) and the relevant unit pixel array does not include an edge part (N of S20), the defect detecting unit 78 determines that a defect exists in the unit pixel array regarding the natural light (S22).

If it is determined that a defect exists in neither the data of the polarization components nor the data of the natural light by the defect detecting unit 78, the defect correcting unit 76 outputs the values of the relevant unit pixel array to the natural light image generating unit 84 as they are (N of S26). If it is determined that a defect exists in at least either of the data of the polarization components and the data of the natural light (Y of S26), the defect correcting unit 76 identifies the channel in which the defect is caused by comparing the detection value of the polarization component and the converted value of the natural light regarding each identical channel (S28).

Qualitatively, the defect correcting unit 76 determines that the defect is included in the channel N regarding which the difference between the total Ssum(N) of the detection values of the polarization component and the total Osum(N) of the converted values of the natural light is equal to or larger than a threshold Th2. Then, the defect correcting unit 76 considers situations such as how the difference between the total Ssum(N) of the detection values of the polarization component and the total Osum(N) of the converted values of the natural light occurs and values in peripheral unit pixel arrays, and carries out complementing by substituting an appropriate value into the channel N in which the defect is included (S30). Then, the defect correcting unit 76 outputs data after the complementing to the natural light image generating unit 84.

Figure 10:
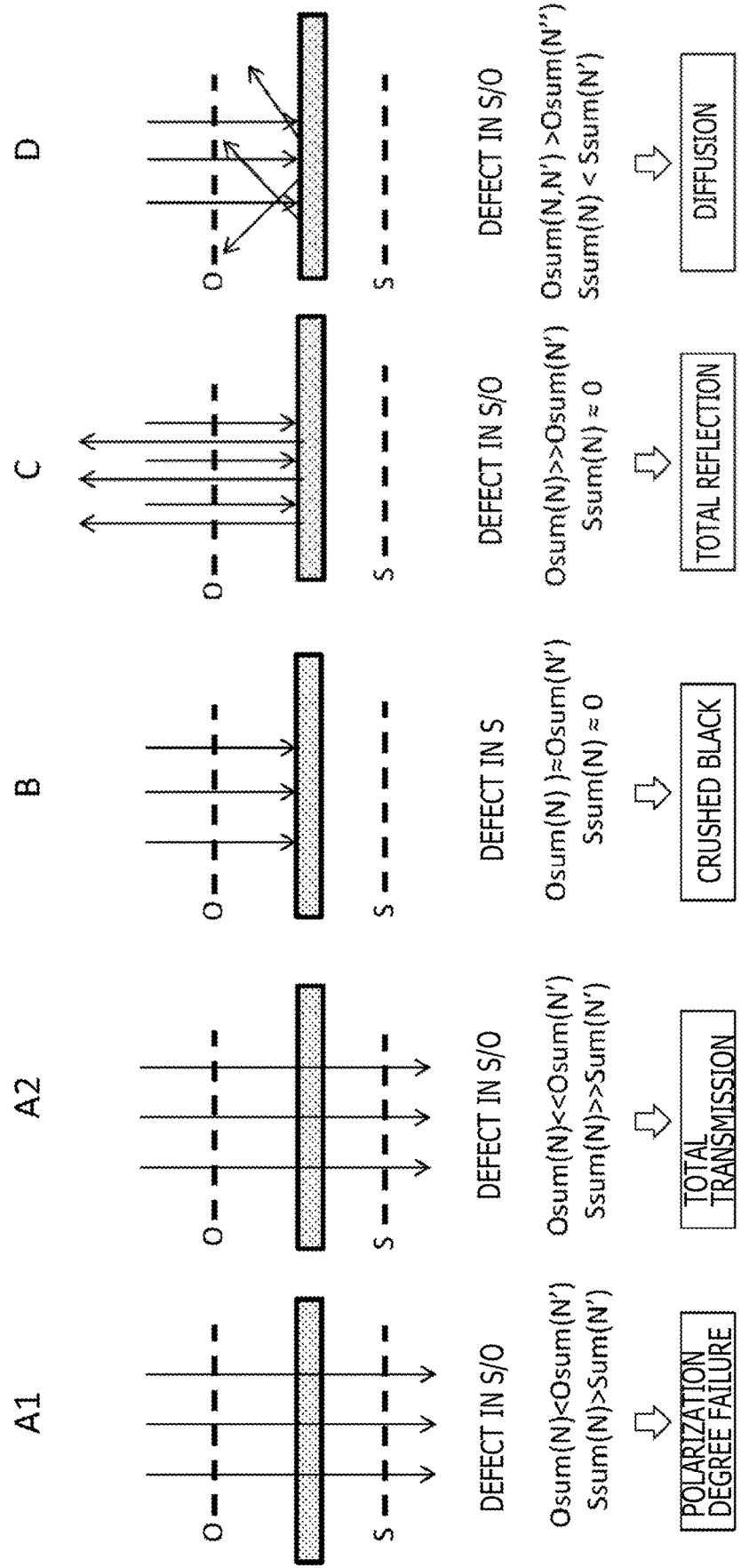
FIG. 10 is a diagram exemplifying the types of the situation and the estimated causes of a defect in the case in which it is determined that a defect exists in data by the defect detecting unit in the present embodiment.

FIG. 10 exemplifies the types of the situation and the estimated causes of a defect when data of the polarization component and data of the natural light are compared in the same channel in the case in which it is determined that a defect exists in at least either of the data of the polarization component and the data of the natural light by the defect detecting unit 78. As a premise, suppose that a defect exists in at least either of the detection value of the polarization component (represented as "S") and the converted value of the natural light (represented as "O") and the difference |Ssum(N)−Osum(N)| between the total of the detection values of the polarization component and the total of the converted values of the natural light surpasses the threshold Th2 in a certain channel N as the result of comparing the totals regarding each channel and therefore it is determined that a defect exists in this channel N.

In the diagram, schematic views under the respective types A1 to D depict sections of the imaging element. Hatched rectangles represent polarizers. Dotted lines over them represent surfaces that detect the natural light. Lower dotted lines represent surfaces that detect the polarization component. Arrows represent incidence of light. First, the type A1 is the case in which the defect exists in at least either S or O and the total Osum(N) of the converted values of the natural light of the channel involving the defect is smaller than the total Osum(N') of the converted values of the natural light of surrounding predetermined positions and the total Ssum(N) of the detection values of the polarization component of the channel involving the defect is larger than the total Ssum(N') of the detection values of surrounding predetermined positions or the immediately-close identical channel.

In this case, it is estimated that "polarization degree failure" due to which part of the polarizer does not correctly function and many components are transmitted is the cause of the defect. The type A2 is similar to the type A1 but is the case in which Osum(N) is significantly smaller than Osum (N') and Ssum(N) is significantly larger than Ssum(N'). In this case, it is estimated that "total transmission" in which the polarizer does not function at all and all polarization components are transmitted is the cause of the defect. In practice, the types A1 and A2 are discriminated by setting thresholds regarding $$O\text{sum}(N')-O\text{sum}(N) \text{ and } S\text{sum}(N)-S\text{sum}(N').$$

The type B is the case in which the defect exists in S and Osum(N) is equivalent to Osum(N') of the surroundings whereas Ssum(N) is a value that can be regarded as 0. In this case, it is estimated that "crushed black" of the polarization component (polarization image) is the cause of the defect because light is neither transmitted nor reflected at the polarizer or the detection mechanism for the polarization component does not function. The type C is the case in which the defect exists in at least S or O and Osum(N) is significantly larger than Osum(N') of the surroundings and Ssum(N) is a value that can be regarded as 0. In this case, it is estimated that "total reflection" of the incident light by the polarizer is the cause of the defect.

The type D is the case in which the defect exists in at least either S or O and the total Osum(N, N') of the converted values of the natural light of the channel involving the defect and the surroundings thereof is larger than the total Osum (N'') of the converted values of the natural light of the further surroundings thereof as a whole and the total Ssum(N) of the detection values of the polarization component is smaller than the total Ssum(N') of the detection values of the surroundings or the immediately-close identical channel. In this case, it is estimated that "diffusion" of the incident light by the polarizer is the cause of the defect. As above, the defect correcting unit 76 can estimate the cause of the defect and select the complementing method according to it as appropriate by referring to the data of the natural light and the data of the polarization component mutually and considering the result of comparison with the values of the surroundings.

In the complementing, it is conceivable that a value obtained at a near position in the same kind of data is substituted or, depending on the estimated cause, the value of the natural light at the same position is substituted if the defect exists in the polarization component or the value of the polarization component at the same position is substituted if the defect exists in the natural light. Alternatively, a value to be substituted may be decided by combining them. In the case of using the same kind of data, the following method is conceivable.

For example, if a defect is detected in 1-channel of the polarization component, an appropriate value Ssum'(1) of the total of the detection values of this channel is obtained as follows by using the above-described orthogonal relation.

Ssum'(1)=Ssum(2)+Ssum(4)−Ssum(3)

Then, by multiplying four pixels included in this channel by Ssum'(1)/Ssum(1), the appropriate value of each pixel is decided. A similar calculation expression can be used also regarding complementing of the converted value of the natural light.

The appropriate value of each channel may be decided by using data in another unit pixel array that is adjacent. For example, if a defect is detected in 1-channel of the polarization component, the sum with the detection value of the polarization component of 3-channel in an adjacent unit pixel array described by a dotted line in FIG. 8 (in the diagram, dotted arrow) is also almost equal to the sum of the detection values of the polarization components of 2-channel and 4-channel in the vicinity thereof. That is, the following expressions hold.

Ssum(1)≈Ssum(2)+Ssum(4)−Ssum(3)

Ssum(1)≈Ssum_l(2)+Ssum_u(4)−Ssum_ul(3)

Ssum(1)≈Ssum(2)+Ssum_u(4)−Ssum_u(3)

Ssum(1)≈Ssum_l(2)+Ssum(4)−Ssum_l(3)

Here, Ssum_ul(3) is the total of the detection values of the polarization component of 3-channel in the unit pixel array on the upper left side of the target unit pixel array 104. Ssum_u(3) and Ssum_u(4) are the totals of the detection values of the polarization components of 3-channel and 4-channel, respectively, in the unit pixel array on the upper side of the target unit pixel array 104. Ssum_l(2) and Ssum_l(3) are the totals of the detection values of the polarization components of 2-channel and 3-channel, respectively, in the unit pixel array on the left side of the target unit pixel array 104. By using this relation, the value obtained by dividing the total of the right sides of the above-described four expressions by 4 may be employed as the appropriate value Ssum'(1) of the total of the polarization component. Also for the other channels, a value can be supplemented through similar calculation.

The natural light image generating unit 84 generates a luminance image of the natural light by using the data complemented as described above according to need. This processing is based on calculating the linear sum of the detection value of the natural light and the detection value of the polarization component for each pixel. Specifically, luminance Y(x, y) is calculated as follows.

Y(x,y)=k(x,y)×O(x,y)+S(x,y)

Here, the coefficient k(x, y) may be the coefficient k(x, y) used when the converted value of the natural light is obtained in the sensitivity difference adjusting unit 75. In this case, the luminance Y(x, y) is obtained as follows.

Y(x,y)=Ocon(x,y)+S(x,y)

Alternatively, the natural light image generating unit 84 may calculate the luminance Y(x, y) as follows.

Y(x,y)=k(x,y)×O(x,y)

Figure 11:
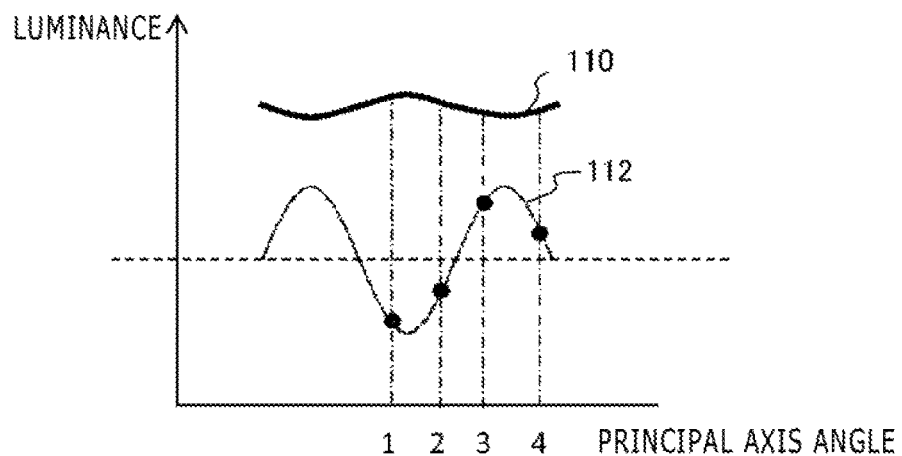
FIG. 11 is a diagram for explaining the position dependency of natural light data that is possibly generated in the present embodiment.

In this case, the position dependency of actual natural light data may be considered and the coefficient k may be adjusted so that image unevenness may be eliminated. FIG. 11 is a diagram for explaining the position dependency of natural light data. The reflected light component from the wire grid polarizer layer 14 is included in light detected by the first light detecting layer 12. This reflected light is the component that is not transmitted through the polarizer, i.e. the polarization component with the orientation orthogonal to the polarization orientation of the detection target of the second light detecting layer 16.

FIG. 11 represents an intensity distribution 110 of light detected by the first light detecting layer 12 and an intensity distribution 112 of light detected by the second light detecting layer 16, with the principal axis angle of the polarizer being on the abscissa axis. Sine waves that represent the intensity distributions 110 and 112 represent qualitative change when the principal axis angle is continuously changed. In practice, values corresponding to the channel numbers represented on the abscissa axis by numerals are discretely obtained. The intensity distribution 112 of light detected by the second light detecting layer 16 depends on the principal axis angle of the polarizer and thus changes as depicted in the diagram with respect to the above-described 1-, 2-, 3-, and 4-channels even when the intensity of incident light on the imaging element is the same.

Naturally, the intensity distribution of the remaining component that is not transmitted through the polarizer but reflected also depends on the principal axis angle of this polarizer. Due to inclusion of approximately ⅓ of this part, position dependency like that depicted in the diagram is caused in the intensity distribution 110 of light detected by the first light detecting layer 12. In the case of calculating the luminance Y based on the linear sum with the detection value of the polarization component, such position dependency is essentially cancelled by properly setting the coefficient k(x, y) for each pixel by calibration. On the other hand, if the detection value of the polarization component is not added, whether or not position dependency exists is checked in actual data and the data is adjusted according to it.

Figure 12:
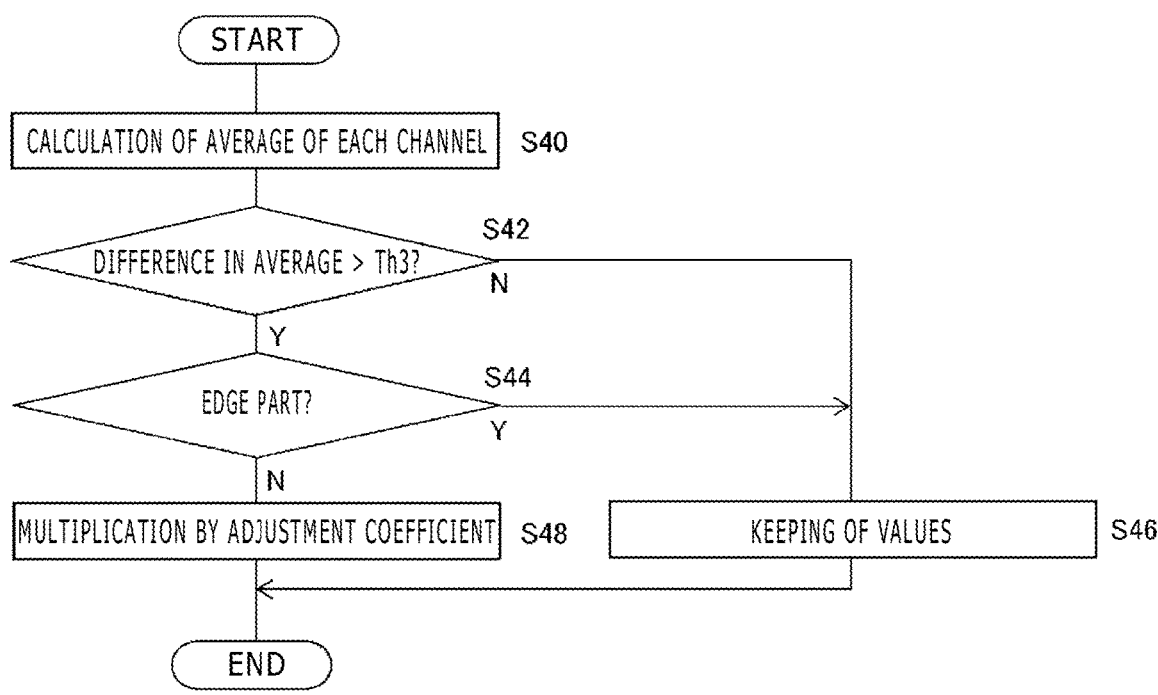
FIG. 12 is a flowchart depicting an example of a processing procedure in which a natural light image generating unit adjusts data of natural light in the present embodiment.

For example, whether or not position dependency exists is checked by averaging each of the converted values of the pixels of four channels included in the same unit pixel array among the converted values of the natural light and comparing the averages. Furthermore, the converted values of the natural light are further adjusted according to need. FIG. 12 is a flowchart depicting an example of a processing procedure in which the natural light image generating unit 84 adjusts data of the natural light. Similarly to the above description, the pixels in the unit pixel array are identified based on expression of (channel number, identification number in channel). First, the average Oave(channel number) of the converted values of the natural light is obtained as follows for each channel (S40).

$$Oave(1) = \sum_{n=1}^{4} Ocon(1, n)/4 \quad \text{[Expression 1]}$$

$$Oave(2) = \sum_{n=1}^{4} Ocon(2, n)/4$$

$$Oave(3) = \sum_{n=1}^{4} Ocon(3, n)/4$$

$$Oave(4) = \sum_{n=1}^{4} Ocon(4, n)/4$$

Then, the averages are compared between channels whose orientations are orthogonal, between which a difference is readily generated in the value. Specifically, Oave(1) and Oave(3) are compared and Oave(2) and Oave(4) are compared (S42). If neither of these differences surpasses a predetermined threshold Th3 (N of S42), it is determined that position dependency does not exist regarding the relevant unit pixel array, and the converted values Ocon are employed as the luminance Y as they are (S46). Furthermore, even if the difference surpasses the threshold, if the unit pixel array includes an edge part, the possibility that this difference is a difference attributed to this edge is high. Therefore, the converted values Ocon are employed as the luminance Y as they are (Y of S42, Y of S44, S46).

For the determination of whether or not the unit pixel array includes an edge part, the result obtained when the defect detecting unit 78 detects a defect may be diverted. If either difference in the average surpasses the threshold (Y of S42) and this unit pixel array does not include an edge part (N of S44), the possibility that position dependency is generated due to the reflected component from the polarizer is high. Therefore, the values are adjusted to cancel out it (S48). For example, if the difference |Oave(1)−Oave(3)| in the average between 1-channel and 3-channel surpasses the threshold Th3, Oave(1) and Oave(3) are adjusted to become the value obtained by averaging both.

Specifically, the converted values of the respective pixels of the natural light of 1-channel and 3-channel are further multiplied by the following adjustment coefficients kcr to be turned to the luminance Y.

kcr(1)=(Oave(1)+Oave(3))/Oave(1)

kcr(3)=(Oave(1)+Oave(3))/Oave(3)

Also when the difference between the average Oave(2) of 2-channel and the average Oave(4) of 4-channel surpasses the threshold Th3, adjustment coefficients kcr(2) and kcr(4) are obtained by similar expressions, and the converted values of the respective pixels are multiplied by the adjustment coefficients kcr(2) and kcr(4) to be turned to the luminance Y.

The natural light image generating unit 84 carries out such position dependency check and adjustment processing according to need for each unit pixel array. In the case of carrying out moving image photographing by the imaging apparatus 100, the position dependency check and the adjustment processing according to need may be carried out at a frequency lower than the frame rate and the adjustment coefficients kcr calculated once may be diverted over plural frames to reduce the load of the processing. The natural light image generating unit 84 carries out multiplication by the adjustment coefficient kcr calculated according to need or takes the sum of the converted value of the natural light and the detection value of the polarization component of the same position to thereby output the resulting value as the pixel value of the final luminance image.

Meanwhile, the polarization image generating unit 86 generates data of polarization images of four channels based on the detection values of polarization components.

Figure 13:
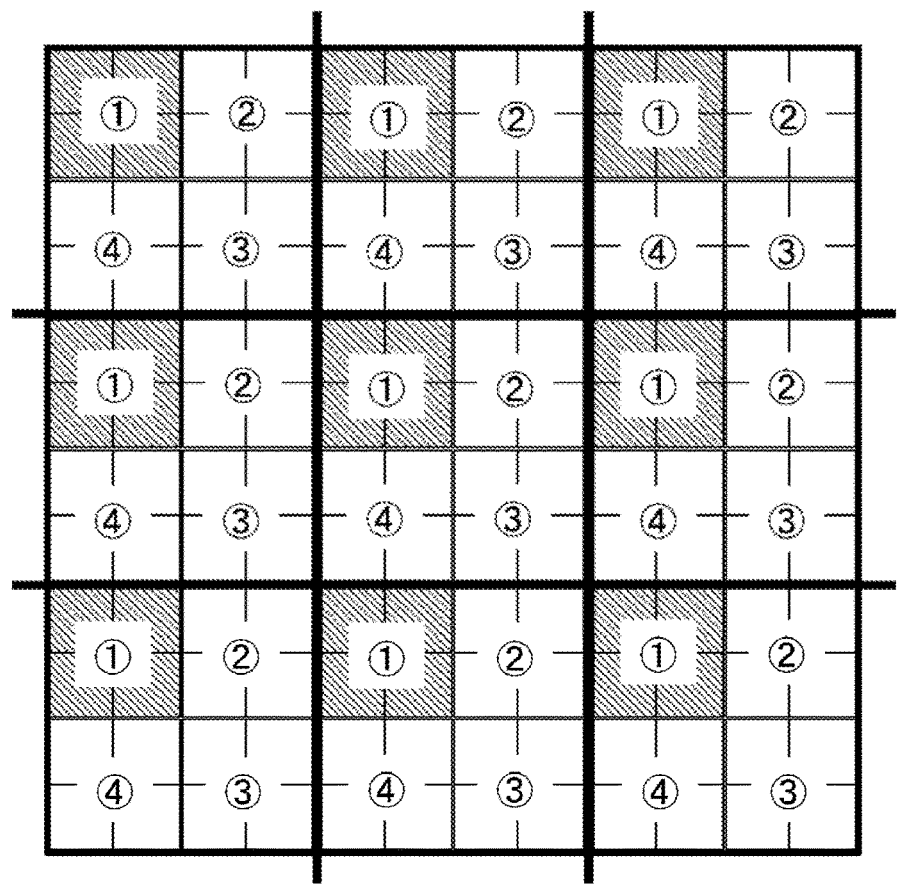
FIG. 13 is a diagram depicting a two-dimensional arrangement of pixels of the second light detecting layer having plural unit pixel arrays in the present embodiment.

FIG. 13 depicts a two-dimensional arrangement of the pixels of the second light detecting layer 16 having plural unit pixel arrays. Heavy lines in this diagram are the boundaries between the unit pixel arrays and the two-dimensional arrangement has a configuration including four pixels in each of 1- to 4-channels represented by numerals. Here, when the pixels of 1-channel are taken as an example, the pixel blocks thereof are discretely disposed to sandwich the pixel blocks of other channels as depicted by hatching. This is the same also in the other channels. Therefore, the polarization image generating unit 86 interpolates pixel values to create data of a polarization image without a gap regarding each channel.

To interpolation processing, an existing interpolation technique such as nearest-neighbor interpolation, bilinear interpolation, or bicubic interpolation is applied as appropriate. However, if merely such interpolation is carried out, the phase of the pixels is displaced depending on the disposing of the channels in the unit pixel array. Therefore, the polarization image generating unit 86 adjusts the positions of the pixels in such a manner that the pixels of four channels existing in the same unit pixel array appear at the same positions in the final polarization images of the respective channels. Specifically, the image of 1-channel is shifted by one pixel in the right direction and by one pixel in the downward direction. The image of 2-channel is shifted by one pixel in the left direction and by one pixel in the downward direction. The image of 3-channel is shifted by one pixel in the left direction and by one pixel in the upward direction. The image of 4-channel is shifted by one pixel in the right direction and by one pixel in the upward direction.

Moreover, as described above, the luminance image generated by the natural light image generating unit 84 is used to allow expression of minute changes at edge parts and so forth. For this purpose, the polarization image generating unit 86 extracts a high-frequency component hf_Y(x, y) from this luminance image by a high-pass filter. Then, regarding pixels including an edge part, processing of adding hf_Y(x, y) to the pixel values is executed for all polarization images of four channels obtained in the above-described manner. Thereby, the final polarization images are generated and output. Also for identification of the edge part here, the result obtained when the defect detecting unit 78 detects a defect may be diverted.

Figure 14:
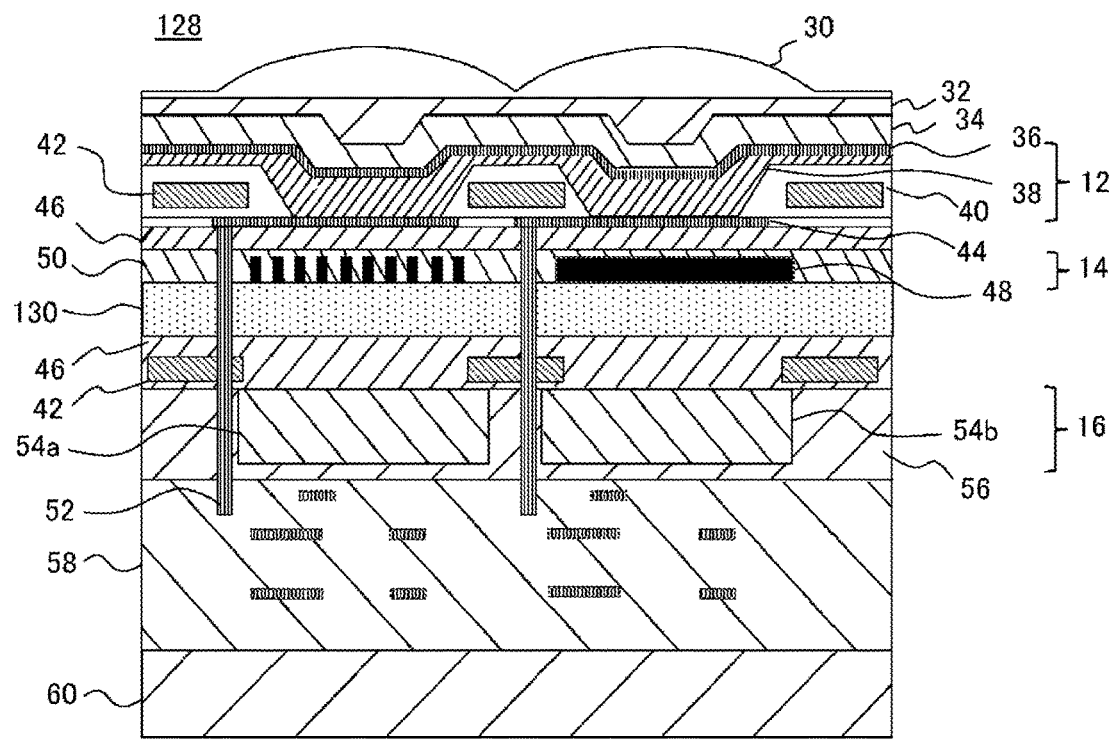
FIG. 14 is a sectional view depicting a structure example of the imaging element when polarization images are acquired as color images in the present embodiment.

The examples described thus far are based on black-and-white images. However, polarization information of plural colors may be acquired through provision of a color filter over the second light detecting layer 16, or the like. FIG. 14 represents, by a sectional view, a structure example of the imaging element when polarization images are acquired as color images. The same configurations as the imaging element 28 depicted in FIG. 4 are given the same numerals. An imaging element 128 has a structure in which a color filter layer 130 is provided between the wire grid polarizer layer 14 of the imaging element 28 depicted in FIG. 4 and the interlayer insulating film 46 under it. Furthermore, in the example of this diagram, a configuration in which one pixel of the first light detecting layer 12 and one pixel of the second light detecting layer 16 correspond to each channel different in the principal axis angle is employed. The second light detecting layer 16 comprises photoelectric conversion elements 54a and 54b The color filter layer 130 has a configuration in which filters of red, blue, and green are disposed with Bayer arrangement, for example.

Figure 15:
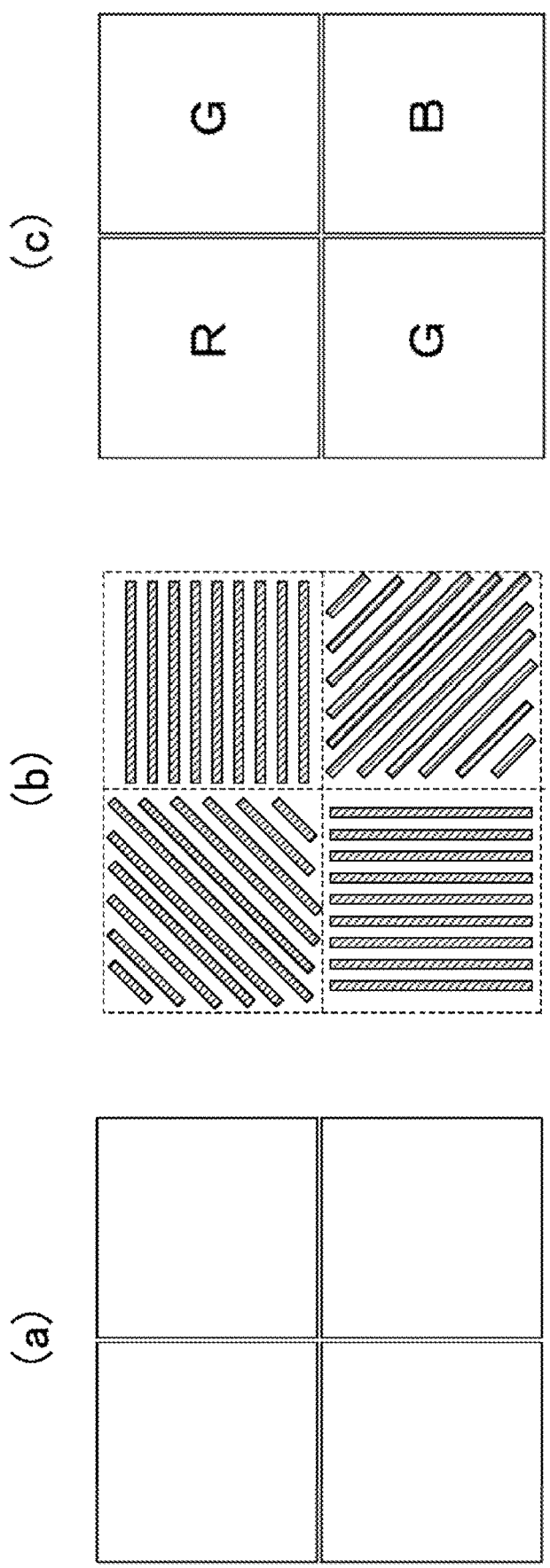
FIG. 15 is a diagram exemplifying the relation between the unit pixel arrays of the first light detecting layer and the second light detecting layer depicted in FIG. 14 and the regions of the polarizers of the respective channels in the wire grid polarizer layer.

FIG. 15 exemplifies the relation between unit pixel arrays of the first light detecting layer 12 and the second light detecting layer 16 in this case and the regions of the polarizers of the respective channels in the wire grid polarizer layer 14. (a) of this diagram is the unit pixel array of the first light detecting layer 12. (b) is the arrangement of the polarizers with the respective principal axis angles in the wire grid polarizer layer 14. (c) is the unit pixel array of the second light detecting layer 16. In this example, as described above, one pixel of the first light detecting layer 12 and the second light detecting layer 16 each corresponds to the polarizer with a respective one of the principal axis angles. Furthermore, due to the color filter layer 130, in the unit pixel array of the second light detecting layer 16 depicted in (c), the upper left pixel detects the polarization component of red (R), and the upper right and lower left pixels detect the polarization components of green (G), and the lower right pixel detects the polarization component of blue (B).

Figure 16:
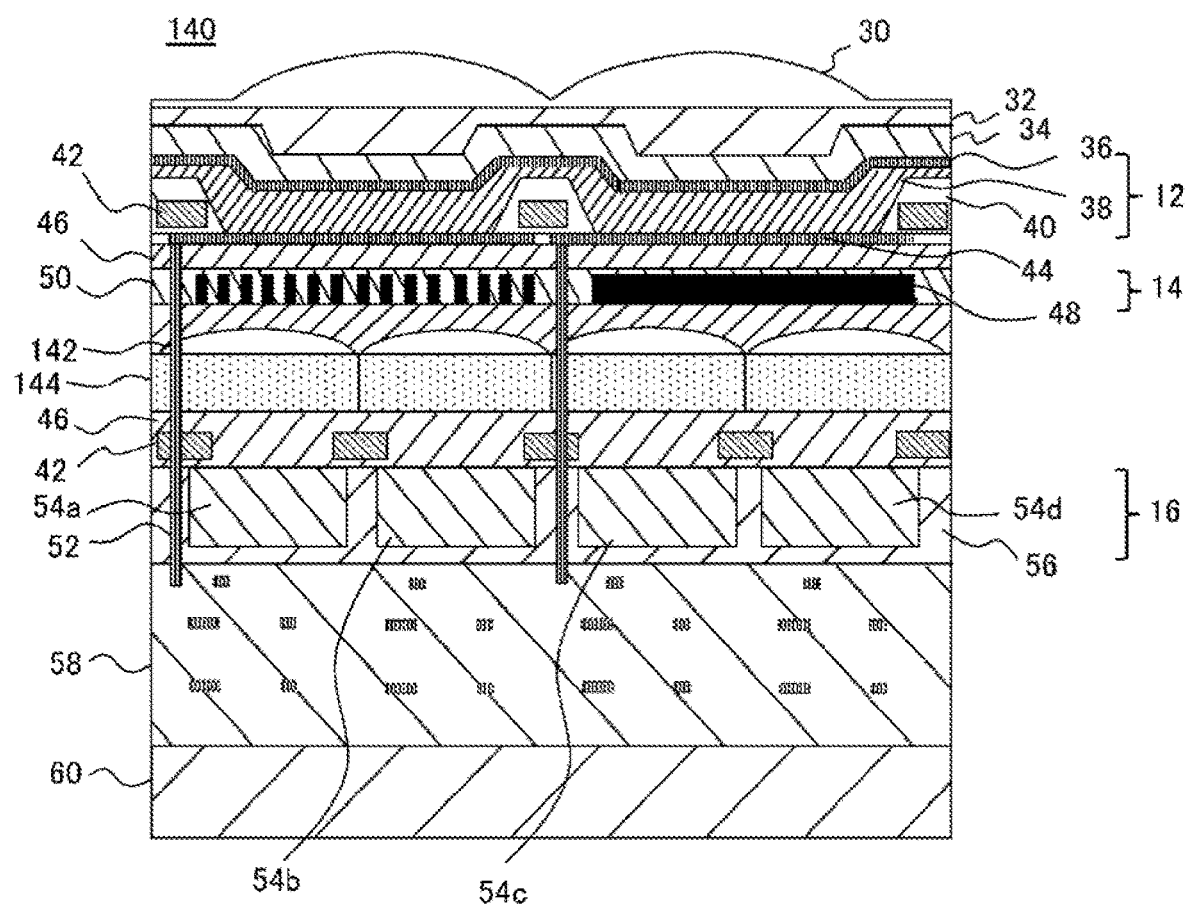
FIG. 16 is a sectional view depicting another example of the structure of the imaging element when polarization images are acquired as color images in the present embodiment.

FIG. 16 represents, by a sectional view, another example of the structure of the imaging element when polarization images are acquired as color images. The same configurations as the imaging element 128 depicted in FIG. 14 are given the same numerals. An imaging element 140 is an element in which four pixels on two rows and two columns are provided for the polarizer with a respective one of the principal axis angles in the second light detecting layer 16. Therefore, in the sectional view, the imaging element 140 has a configuration in which, with respect to the regions of the polarizers with two principal axis angles, photoelectric conversion elements 54a, 54b, 54c, and 54d are lined up two by two in the second light detecting layer 16. Furthermore, in this example, by providing in-chip microlenses 142 on a color filter layer 144, light transmitted through the wire grid polarizer layer 14 is allowed to be focused on each pixel of the second light detecting layer 16.

Figure 17:
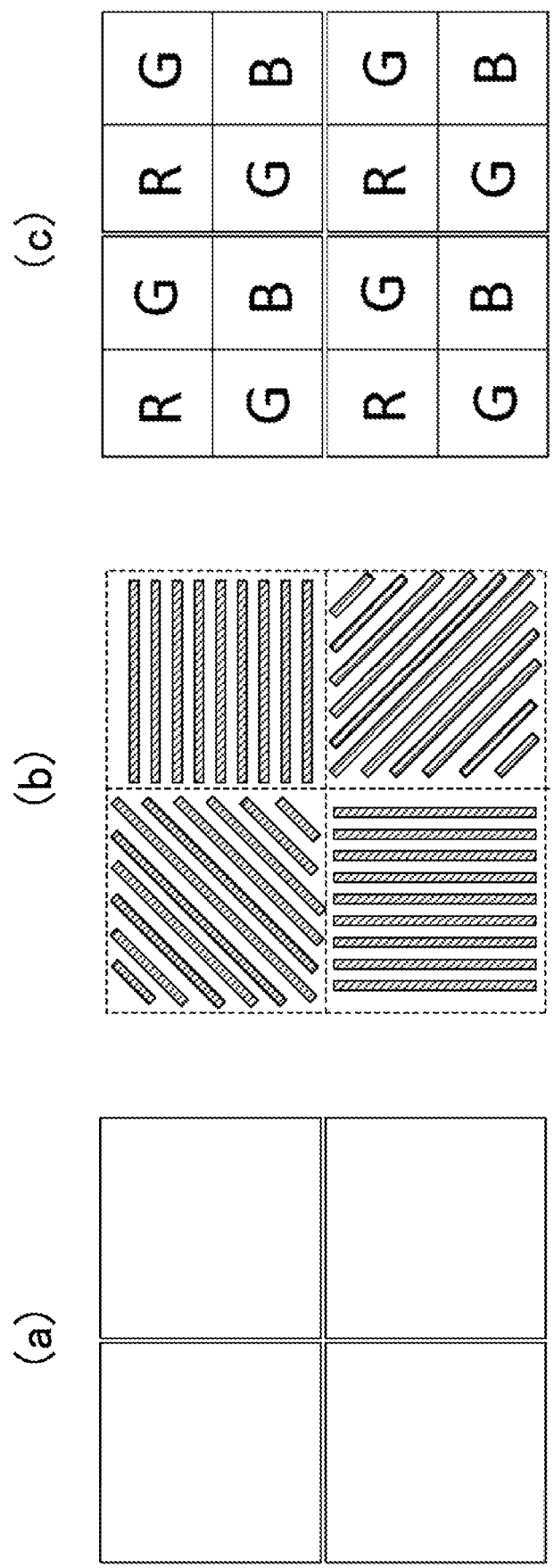
FIG. 17 is a diagram exemplifying the relation between the unit pixel arrays of the first light detecting layer and the second light detecting layer depicted in FIG. 16 and the regions of the polarizers of the respective channels in the wire grid polarizer layer.

FIG. 17 exemplifies the relation between unit pixel arrays of the first light detecting layer 12 and the second light detecting layer 16 in this case and the regions of the polarizers of the respective channels in the wire grid polarizer layer 14. (a) of this diagram is the unit pixel array of the first light detecting layer 12. (b) is the arrangement of the polarizers with the respective principal axis angles in the wire grid polarizer layer 14. (c) is the unit pixel array of the second light detecting layer 16. Compared with the case depicted in FIG. 15, the pixels of the second light detecting layer are each segmentalized into two rows and two columns as described above and four pixels are provided for the polarizer with a respective one of the principal axis angles. Furthermore, due to the color filter layer 144, in the pixel block having these four pixels, the upper left pixel detects the polarization component of red (R), and the upper right and lower left pixels detect the polarization components of green (G), and the lower right pixel detects the polarization component of blue (B).

Figure 18:
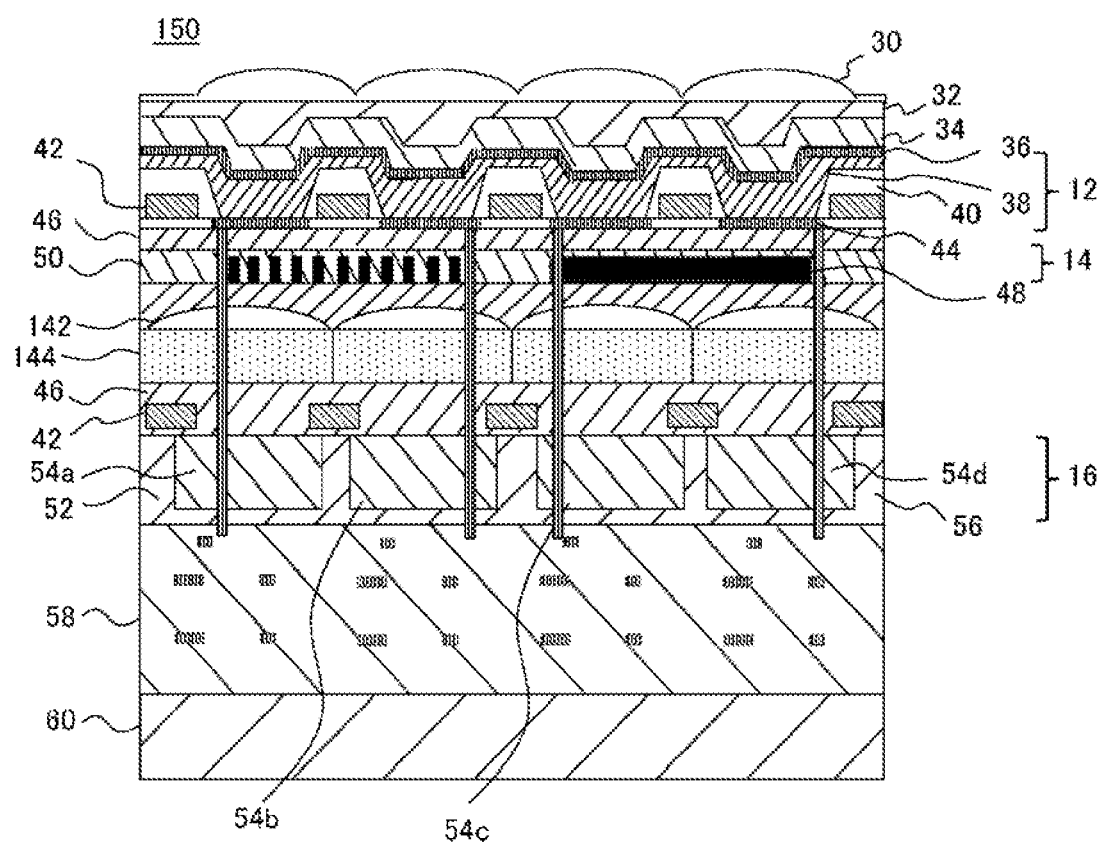
FIG. 18 is a sectional view depicting another example of the structure of the imaging element when polarization images are acquired as color images in the present embodiment.

FIG. 18 represents, by a sectional view, further another example of the structure of the imaging element when polarization images are acquired as color images. The same configurations as the imaging element 140 depicted in FIG. 16 are given the same numerals. An imaging element 150 is an element in which four pixels on two rows and two columns are provided for the polarizer with a respective one of the principal axis angles in both the first light detecting layer 12 and the second light detecting layer 16. Therefore, in the sectional view, the imaging element 150 has a configuration in which the lower electrodes 44 corresponding to pixels of the first light detecting layer 12 are lined up two by two with respect to the regions of the polarizers with two principal axis angles. This is the same also in the photoelectric conversion elements 54a, 54b, 54c, and 54d of the second light detecting layer 16.

Figure 19:
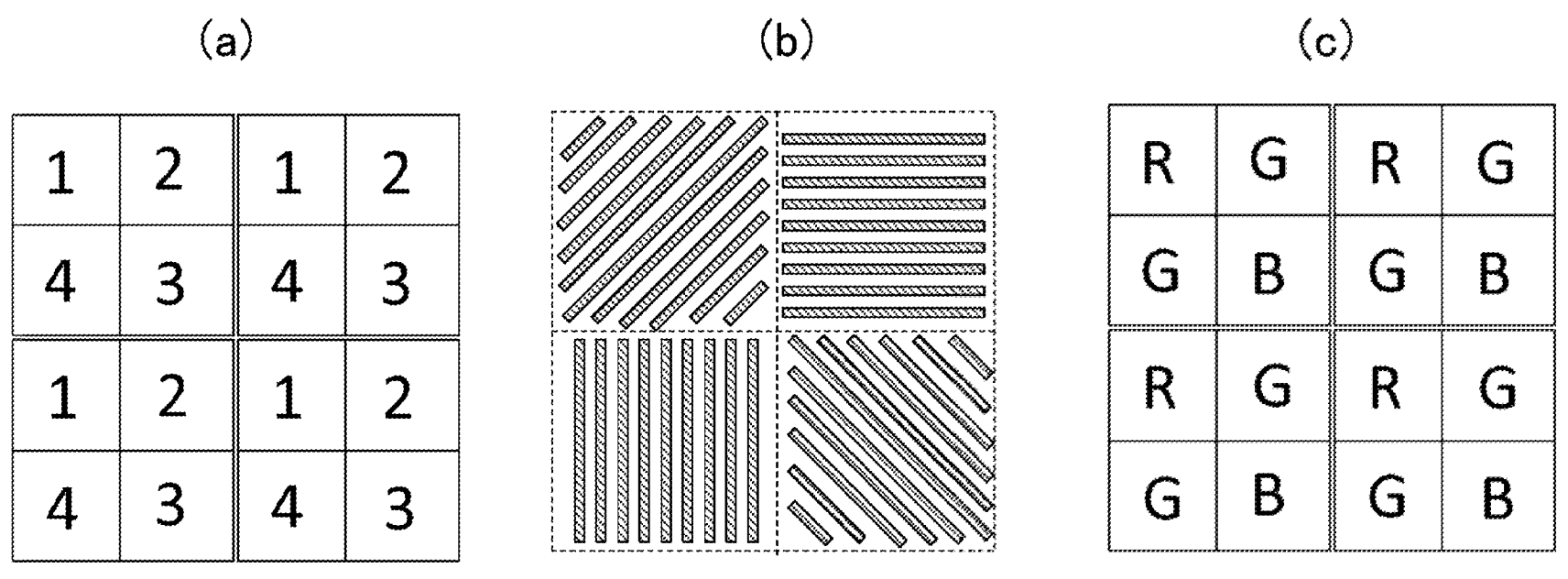

FIG. 19 exemplifies the relation between unit pixel arrays of the first light detecting layer 12 and the second light detecting layer 16 in this case and the regions of the polarizers of the respective channels in the wire grid polarizer layer 14. (a) of this diagram is the unit pixel array of the first light detecting layer 12. (b) is the arrangement of the polarizers with the respective principal axis angles in the wire grid polarizer layer 14. (c) is the unit pixel array of the second light detecting layer 16. Compared with the case depicted in FIG. 17, the pixels of the first light detecting layer are each segmentalized into two rows and two columns as described above and four pixels are provided for the polarizer with a respective one of the principal axis angles.

As depicted in FIGS. 14, 16, and 18, the regions of one pixel of the first light detecting layer 12 and the second light detecting layer 16 can be variously combined depending on the sizes and the numbers of lower electrodes 44 and photoelectric conversion elements 54. For example, the unit pixel array of the first light detecting layer 12 may be set to 16 pixels on four rows and four columns as depicted in FIG. 19 and the unit pixel array of the second light detecting layer 16 may be set to four pixels on two rows and two columns as depicted in FIG. 15.

In the case of acquiring polarization as color information, polarization information of the same color and the same orientation readily becomes more discrete in the image plane as described later. Thus, the unit of the pixel of each detecting layer is properly decided from diversified standpoints such as the acquisition accuracy of required data and easiness of manufacturing of the element. Such a variation of the pixel size can be similarly applied also to the mode in which the above-described black-and-white image is acquired.

Figure 20:
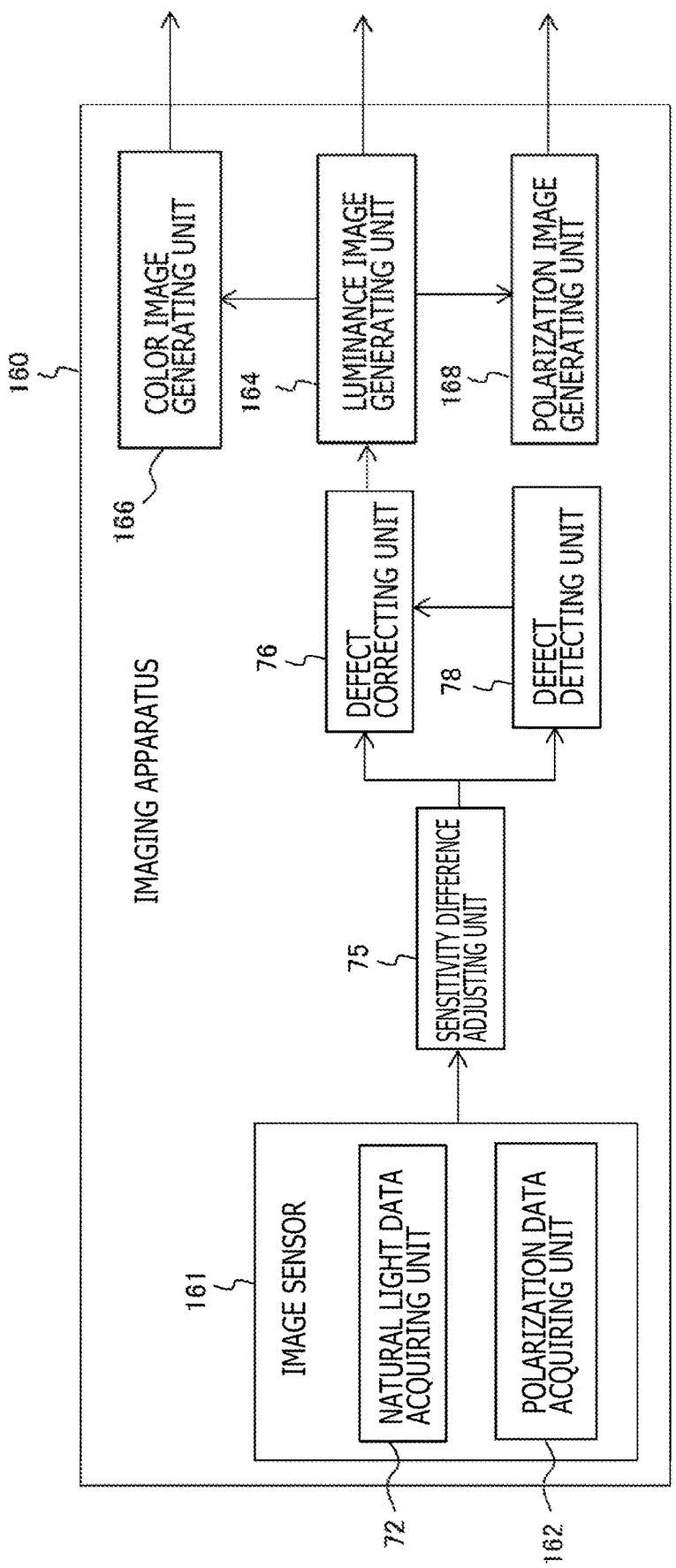
FIG. 20 is a diagram depicting functional blocks of an imaging apparatus including an image sensor that acquires polarization components as color information in the present embodiment.

Furthermore, in the imaging elements 140 and 150 of FIGS. 16 and 18, the structures in which the in-chip microlenses 142 are provided on the color filter layer 144 are employed. However, the in-chip microlenses 142 may be provided on the wire grid polarizer layer 14 depending on the size of the pixel region and so forth. In this case, light reflected by the polarizers can be diffused and be evenly detected by the first light detecting layer 12. When polarization components are acquired as color information as above, a color image of the natural light can also be generated by using this information. FIG. 20 depicts functional blocks of an imaging apparatus including an image sensor that acquires polarization components as color information.

Functional blocks having the same functions as the imaging apparatus 100 depicted in FIG. 7 are given the same numerals and description is omitted as appropriate. An imaging apparatus 160 includes an image sensor 161, the sensitivity difference adjusting unit 75, the defect detecting unit 78, the defect correcting unit 76, a luminance image generating unit 164 that generates a luminance image of the natural light, a color image generating unit 166 that generates a color image of the natural light, and a polarization image generating unit 168 that generates a color polarization component image. The image sensor 161 has a structure similar to that of the image sensor 70 depicted in FIG. 5 and basically has functions similar to those of the image sensor 70 in FIG. 7.

However, because the imaging elements include a color filter layer as depicted in FIGS. 14, 16, and 18, the detection values of the polarization components output from a polarization data acquiring unit 162 include a combination of polarization information of plural orientations and color information of red, blue, and green. The sensitivity difference adjusting unit 75, the defect detecting unit 78, and the defect correcting unit 76 each have the same functions as the corresponding functional block described with reference to FIG. 7.

The luminance image generating unit 164 generates a luminance image of the natural light that should be output finally based on the converted values of the natural light, the detection values of the polarization components, and so forth similarly to the natural light image generating unit 84 in FIG. 7. However, in this case, because the color (wavelength band) of the detection target is different depending on the pixel, it is conceivable that unevenness of the luminance is caused in a Bayer arrangement manner if simply the sum of the converted value of the natural light and the detection value of the polarization component is obtained for each pixel. Therefore, by taking the sum in a binning image obtained by processing four pixels as one pixel virtually, luminance information that does not depend on the color of the detection target and is free from unevenness is obtained. Specifically, luminance $Y_{1/4}(x, y)$ of every four pixels is obtained as follows.

$$Y_{1/4}(i,j) = Ocon_{1/4}(i,j) + S_{1/4}(i,j)$$

Here, (i, j) is the position coordinates when the original image plane represented by (x, y) is reduced to ¼. $Ocon_{1/4}(i, j)$ is the pixel value, in the binning image, of the converted value $Ocon(x, y)$ of the natural light obtained by multiplication by a default value of the coefficient $k(x, y)$, generated by the sensitivity difference adjusting unit 75. $S_{1/4}(i, j)$ is the pixel value of the detection value $S(x, y)$ of the polarization component in the binning image. The luminance image generating unit 164 returns the luminance $Y_{1/4}(i, j)$ obtained in this manner to the original resolution. Specifically, the luminance image generating unit 164 quadruples the number of pixels through interpolation of the two-dimensional arrangement of the luminance $Y_{1/4}(i, j)$ and so forth and thereafter restores details by adding a high-frequency component of the two-dimensional arrangement of the converted value $Ocon(x, y)$ of the natural light. The luminance image generating unit 164 outputs the generated luminance image with the original resolution to a storing apparatus connected to the imaging apparatus 160 and an image processing apparatus as appropriate.

Figure 21:
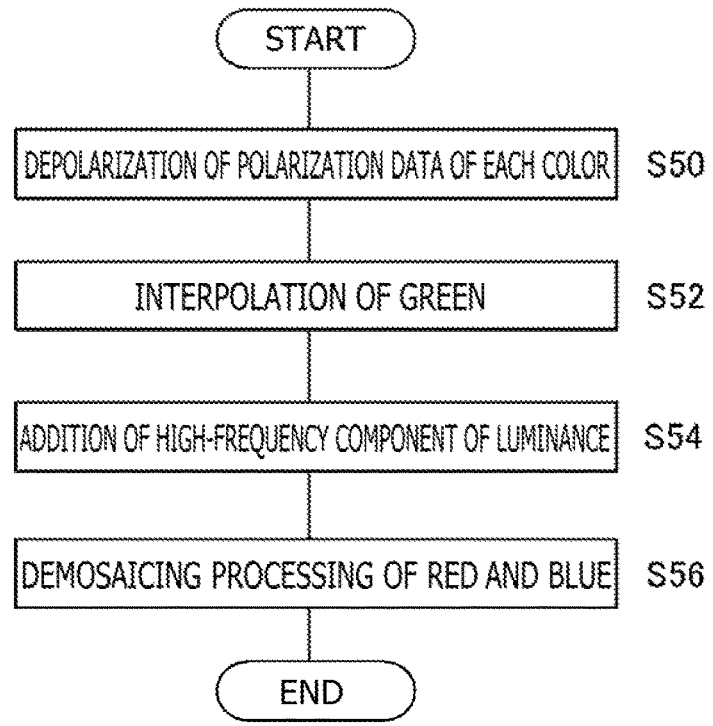
FIG. 21 is a flowchart depicting a processing procedure in which a color image generating unit generates a color image of the natural light in the present embodiment.

The color image generating unit 166 generates a color image of the natural light based on the detection values of the polarization components. FIG. 21 is a flowchart depicting a processing procedure in which the color image generating unit 166 generates a color image of the natural light. First, the color image generating unit 166 carries out depolarization of the detection values of the polarization components for each color (S50). The depolarization is eliminating position dependency due to the polarization orientation from the detection values of the polarization components. To this processing, the adjustment processing for eliminating the position dependency of the natural light, depicted in FIG. 12, can be applied.

Specifically, regarding each color, the detection values of polarization components are compared between channels whose orientations are orthogonal (S42 in FIG. 12). At this time, if plural pixels of the same color are included in one channel, the averages thereof are calculated and compared (S40 in FIG. 12). In the case of the unit pixel array depicted in FIG. 19, two green pixels are included in each channel and therefore the comparison is made with the averages of the detection values of the two pixels regarding green. If neither of these differences surpasses a predetermined threshold (N of S42 in FIG. 12) or if the unit pixel array includes an edge part even when the difference surpasses the threshold (Y of S42, Y of S44 in FIG. 12), it is determined that position dependency does not exist regarding the relevant color of the relevant unit pixel array, and the detection values of the polarization components are employed as they are (S46 in FIG. 12).

If either difference surpasses the threshold and this unit pixel array does not include an edge part (Y of S42, N of S44 in FIG. 12), the position dependency due to the difference in the polarization orientation is high and therefore the values are adjusted to cancel out it (S48 in FIG. 12). Specifically, the detection values of the polarization components are averaged between both channels. If plural pixels of the same color are included in one channel and the comparison is made with the averages, these averages are averaged between both channels. In this case, similarly to adjustment of the converted values of the natural light, the detection values of the plural pixels included in a respective one of orthogonal channel n and channel n+2 between which the difference in the average is large are multiplied by the following adjustment coefficients kcr(n) and kcr(n+2).

$$kcr(n) = (Save(n) + Save(n+2))/Save(n)$$

$$kcr(n+2) = (Save(n) + Save(n+2))/Save(n+2)$$

Here, Save(n) and Save(n+2) are the averages of the detection values of the pixels included in the channel n and the channel n+2, respectively. By carrying out the above position dependency check and adjustment processing according to need for each color and for each unit pixel array, the detection values of the polarization components of each color can be depolarized. Next, the color image generating unit 166 executes demosaicing processing of interpolating the pixel values of each color discretely represented in the Bayer arrangement. First, the color image generating unit 166 interpolates the pixel values of green, which has a larger number of pixels (S52).

At this time, details of the image are restored by adding a high-frequency component of the luminance image generated by the luminance image generating unit 164 (S54). The addition processing of the high-frequency component in S54 may be executed as part of the interpolation processing of S52 or may be separately executed after the interpolation processing. After the pixel values of green regarding all pixels are obtained in this manner, demosaicing processing of red and blue is executed by using them (S56). For this processing, a method of demosaicing processing executed in a general imaging apparatus may be employed.

By the above processing, a full-color natural light image can be generated based on the color information of the polarization components. The color image generating unit 166 outputs data of the generated image to the storing apparatus connected to the imaging apparatus 160 and the image processing apparatus as appropriate. This image is an image equivalent to a general full-color image and therefore may be output to a display apparatus such as a television and be displayed.

Figure 22:
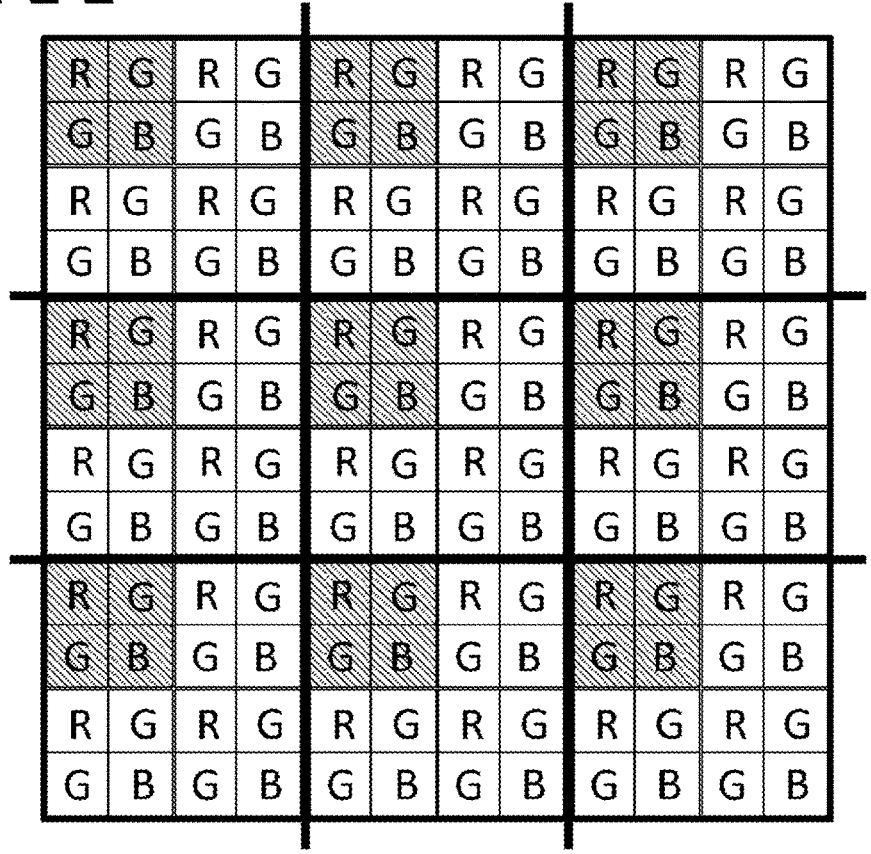
FIG. 22 is a diagram depicting a two-dimensional arrangement of pixels of the second light detecting layer having plural unit pixel arrays in the present embodiment.

The polarization image generating unit 168 generates data of color polarization images of four channels based on the detection values of the polarization components. FIG. 22 depicts a two-dimensional arrangement of the pixels of the second light detecting layer 16 having plural unit pixel arrays. Heavy lines in this diagram are the boundaries between the unit pixel arrays and the two-dimensional arrangement has a configuration including four pixels in each of 1- to 4-channels as depicted in FIG. 19. However, also with a pixel arrangement like that depicted in FIG. 15 or 17, the procedure of generating the polarization image is also the same. If the polarization components are acquired as color information, the pixels of the same channel and the same color need to be extracted and interpolated.

When the pixels of 1-channel depicted by hatching in this diagram are taken as an example, as the pixels of green (G) of 1-channel, two pixels exist per unit pixel array on four rows and four columns. On the other hand, as the pixels of red (R) and blue (B), only one pixel exists per unit pixel array. Therefore, the pixels of red and blue have a wider interval compared with green. Therefore, first the pixel values of green of the respective channels are extracted and interpolated and the pixel values of red and blue are obtained by the demosaicing processing by using them. To interpolation processing of green, an existing interpolation technique such as nearest-neighbor interpolation, bilinear interpolation, or bicubic interpolation is applied as appropriate.

Regarding the interpolated pixel values of green of the respective channels, the luminance image generated by the luminance image generating unit 164 is used to allow expression of minute changes at edge parts and so forth. For this purpose, the polarization image generating unit 168 extracts a high-frequency component hf_Y(x, y) from this luminance image by a high-pass filter and adds hf_Y(x, y) to the pixel value of green regarding pixels including an edge part. By using the pixel values of green of the respective channels obtained in this manner and the discrete detection values of the polarization components of red and blue, the pixel values of red and blue of the polarization components of the respective channels are decided.

To this processing, general demosaicing processing can be applied as appropriate. Furthermore, in the arrangement of the pixel values of the respective colors of the respective channels generated in this manner, the phase of the pixels is displaced depending on the disposing of the channels in the unit pixel array and the disposing of the colors in the respective channels. Therefore, the positions of the pixels are adjusted in such a manner that the pixels of the respective colors of the respective channels existing in the same unit pixel array express the pixels at the same positions in the final polarization images of the respective channels. Specifically, regarding red, the positions of the pixels are shifted by 0.5 pixels in the right direction and by 0.5 pixels in the downward direction.

Regarding blue, the positions of the pixels are shifted by 0.5 pixels in the left direction and by 0.5 pixels in the upward direction. Regarding green, because two pixels exist in the same channel, the positions of the pixels are shifted by 0.5 pixels in the left direction or the right direction and by 0.5 pixels in the downward direction or the upward direction. The polarization image generating unit 168 outputs color polarization images of the respective channels generated in this manner to the storing apparatus connected to the imaging apparatus 160 and the image processing apparatus as appropriate.

Next, techniques in which information on a subject is acquired by using the imaging apparatuses described thus far will be exemplified. Regarding techniques in which the normal to a subject surface is acquired by using a polarizer or a polarizing plate, researches are being advanced conventionally as disclosed in PCT Patent Publication No. WO09/147814, for example. Specifically, reflected light from a surface of a subject is acquired by a polarization camera and the azimuth of the object surface is acquired based on the polarization angle when the minimum luminance is observed. By carrying out this from two points of view, the normal to the object surface can be uniquely decided.

Figure 23:
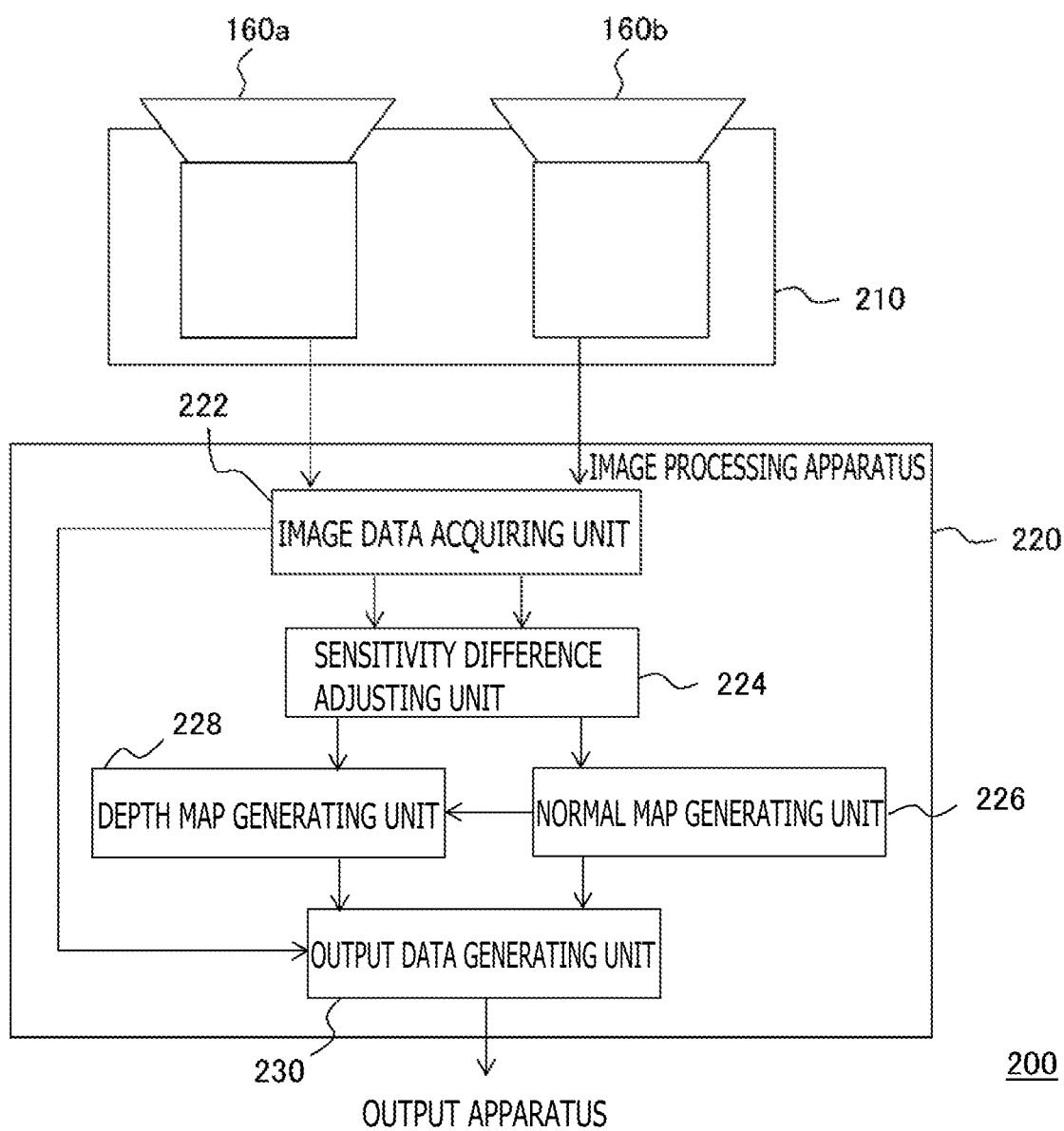
FIG. 23 is a diagram depicting a configuration example of an image processing system of the present embodiment.

The imaging element of the present embodiment can acquire polarization information and information on natural light from the same point of view in the state in which the positions are aligned at the pixel level. Thus, by using this, various kinds of information can be acquired and the acquisition accuracy can be enhanced. FIG. 23 depicts a configuration example of an image processing system of the present embodiment. An image processing system 200 includes a stereo camera 210 and an image processing apparatus 220. The stereo camera 210 and the image processing apparatus 220 may be provided as separate individuals as depicted in the diagram and communication may be established in a wired or wireless manner to carry out transmission and reception of data. Alternatively, a form of an information processing apparatus integrally including both or the like may be employed and transmission and reception of data may be carried out by an internal bus or the like. This is the same also regarding image processing systems of FIGS. 24 and 26 to be described later. The stereo camera 210 is a camera in which two imaging apparatuses 160a and 160b with the same configuration as the imaging apparatus 160 depicted in FIG. 20 are disposed on the left and right to have a known interval.

The image processing apparatus 220 includes an image data acquiring unit 222 that acquires data of images from the stereo camera 210, a sensitivity difference adjusting unit 224 that adjusts the sensitivity difference between the acquired left and right image data, a normal map generating unit 226 that generates a normal map based on left and right polarization images, a depth map generating unit 228 that generates a depth map based on left and right natural light images and the normal map, and an output data generating unit 230 that generates data that should be output.

The image data acquiring unit 222 acquires color images of natural light and color images of the polarization component from the imaging apparatuses 160a and 160b, respectively, included in the stereo camera 210. Specifically, data of color images of the natural light from the left and right points of view and color polarization images of four channels from the left and right points of view are acquired. At the time of moving image photographing, the image data acquiring unit 222 keeps on acquiring data at a predetermined frame rate. The acquired data is temporarily stored in a memory, which is not depicted in the diagram, in predetermined unit, such as on each frame basis, to allow the data to be read out by the sensitivity difference adjusting unit 224 and so forth at appropriate timing. The sensitivity difference adjusting unit 224 adjusts the output level with each of the pair of color images of the natural light from the left and right points of view and the pair of polarization images of the respective channels from the left and right points of view.

For example, the sensitivity difference adjusting unit 224 calculates an average luminance value regarding each image and applies a gain to one image in such a manner that the average luminance values become the same level. The gain applied to the color image of the natural light may be employed as the gain for the polarization image from the same point of view. The normal map generating unit 226 obtains normal vectors to a subject surface by using the left and right polarization images of four channels and generates a normal map obtained by mapping them on the image plane. To this processing, the above-described conventional technique in which normal information of a subject is acquired by using a stereo polarization camera can be applied. The depth map generating unit 228 first generates a depth map by using the left and right color images of the natural light for which level adjustment has been carried out.

Specifically, the depth map generating unit 228 detects corresponding points from the left and right color images and calculates the distances of these corresponding points from the imaging plane from the disparity thereof on the principle of triangulation to generate the depth map by mapping the distances on the image plane. Techniques for generating a depth map by using stereo images have been put into practical use in conventional stereo cameras. However, with a subject having a uniform surface with poor feature points such as patterns and wrinkles, or the like, the feature points are difficult to detect. As a result, in some cases, the calculation of the distances involves many errors, or the calculation becomes impossible and omission of data occurs on the depth map.

Therefore, the depth map generating unit 228 according to the present embodiment improves the accuracy of the depth map by using the normal map generated by the normal map generating unit 226. Specifically, the depth map generating unit 228 acquires the continuity of the surface of the subject based on the distribution of the normal vectors. Due to this, even when the points whose distance is obtained by the corresponding point detection are discrete, it can be identified whether or not an image of the periphery thereof represents the same surface that is continuous and thus distance values in a region from which corresponding points are not detected can be calculated from the normal vectors.

The depth map generating unit 228 may further use the polarization image for the detection itself of corresponding points and utilize minute recesses and protrusions in an object surface that appear in the polarization image as feature points. In the present embodiment, the positions of an image in the natural light image and the polarization image correspond with each other at the pixel level at the stage of photographing. Thus, there is no need to carry out position alignment of both later. As a result, the depth map can be accurately acquired even with a subject having poor feature points seemingly.

The output data generating unit 230 outputs, to an external output apparatus, necessary data in pieces of data of the generated normal map and depth map, the color images of the natural light acquired by the image data acquiring unit 222, and so forth. Alternatively, the output data generating unit 230 may generate and output data of a display image or sound as the result of execution of predetermined information processing with use of these pieces of data. The data that should be output and the information processing that should be executed may be various depending on the use purpose of the image processing system 200.

For example, the position of a subject in a real space is identified by using the depth map accurately obtained and, according to it, processing is carried out on a color image of natural light or a game screen that reacts to the motion of the subject is generated. If data of the image generated in this manner is output to a display that is an output apparatus at proper timing, a moving image that changes according to the motion of the subject can be displayed. However, the output mode is not limited thereto as described above.

Figure 24:
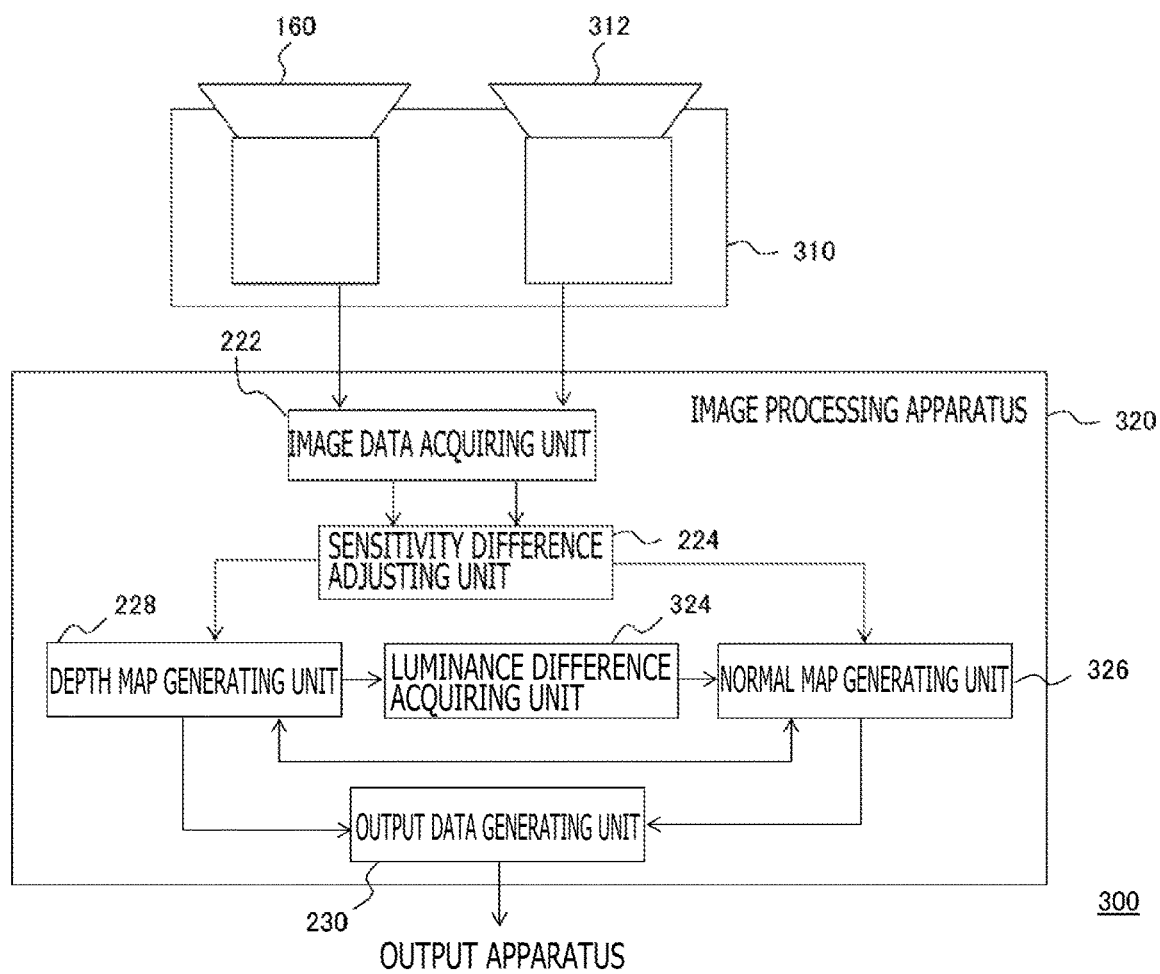
FIG. 24 is a diagram depicting a configuration example of the image processing system of the present embodiment.

FIG. 24 depicts another example of the configuration of the image processing system of the present embodiment. In this diagram, blocks having the same functions as those depicted in FIG. 23 are given the same numerals and description is omitted as appropriate. An image processing system 300 includes a stereo camera 310 and an image processing apparatus 320. The stereo camera 310 is a camera in which the imaging apparatus 160 depicted in FIG. 20 and an imaging apparatus 312 of a general color image are disposed on the left and right to have a known interval.

The image processing apparatus 320 includes the image data acquiring unit 222 that acquires data of images from the stereo camera 310, the sensitivity difference adjusting unit 224 that adjusts the sensitivity difference between the acquired left and right image data, the depth map generating unit 228 that generates a depth map, a luminance difference acquiring unit 324 that acquires the luminance difference between left and right natural light images, a normal map generating unit 326 that generates a normal map, and the output data generating unit 230 that generates data that should be output.

The image data acquiring unit 222 acquires data of images from the stereo camera 310 similarly to the case of FIG. 23. However, in this case, data from the left and right points of view is acquired as color images of the natural light whereas the color polarization image is only data from the point of view on the single side obtained from the imaging apparatus 160. The sensitivity difference adjusting unit 224 carries out adjustment to align the output levels of the color images of the natural light from the left and right points of view similarly to the case of FIG. 23. The depth map generating unit 228 also extracts corresponding points from the left and right natural light images and calculates distances of the subject from the imaging plane based on the disparity thereof to generate initial data of a depth map similarly to the case of FIG. 23.

Figure 25:
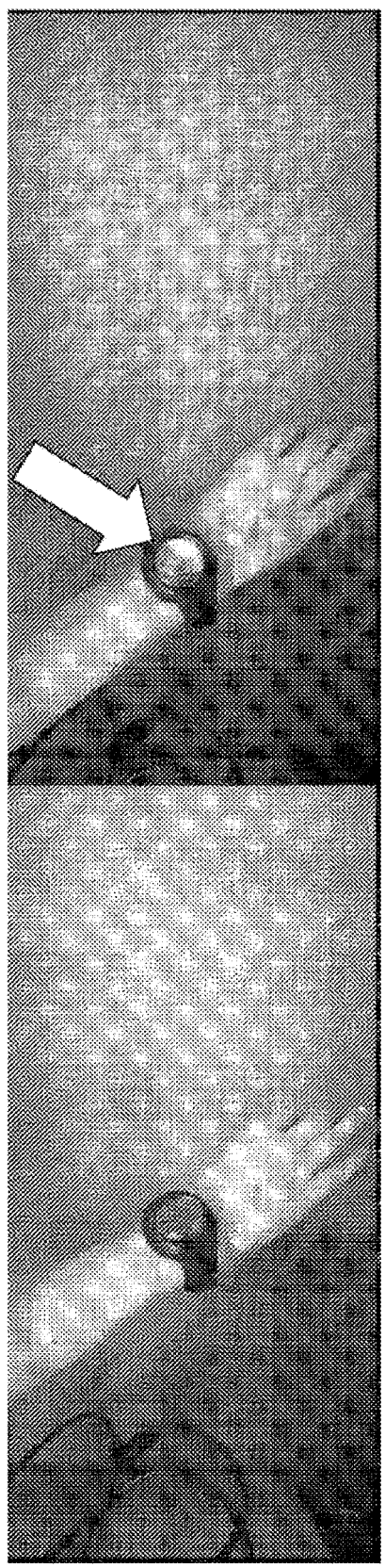
FIG. 25 is a diagram comparing left and right natural light images actually photographed in the present embodiment.

The luminance difference acquiring unit 324 acquires the luminance difference of corresponding regions in the left and right images based on the disparity between the left and right calculated by the depth map generating unit 228. It is considered that, if the difference in the luminance is large between the left and right images although the images represent the image of the same subject, the specular reflection component is dominant in the image with the higher luminance. FIG. 25 compares left and right natural light images actually photographed. At a part indicated by an arrow in the image on the right side in this diagram, compared with the corresponding part in the image on the left side, the luminance is significantly high and the specular reflection component will be dominant. The luminance difference acquiring unit 324 compares the luminance between corresponding pixels or regions of images in both images and generates a luminance difference image that represents the difference regarding each of the pixels or the regions of images.

Based on the luminance difference image generated by the luminance difference acquiring unit 324, the normal map generating unit 326 carries out threshold determination or the like to decide a region in which the specular reflection component is dominant and the other region, i.e. a region in which the diffuse reflection component is dominant. Then, the normal map generating unit 326 estimates the azimuths of the subject by calculation methods suitable for a respective one of the regions. In general, it is known that the incident surface (orientation) is the angle at which the luminance becomes the minimum value with respect to the polarization orientation if the specular reflection component is dominant and the incident surface (orientation) is the angle at which the luminance becomes the maximum value with respect to the polarization orientation if the diffuse reflection is dominant. Therefore, the normal map generating unit 326 approximates such a sine wave of the luminance as to interpolate the polarization orientations of four channels based on polarization images obtained from the imaging apparatus 160 and thereafter obtains the azimuths of the subject surface by a method suitable for a respective one of the regions according to which of the specular reflection component and the diffuse reflection component is dominant.

Furthermore, the normal map generating unit 326 obtains normal vectors to the subject surface by using the initial data of the depth map generated by the depth map generating unit 228. For example, the normal map generating unit 326 obtains positions of the subject surface in a three-dimensional space as a point group by carrying out back projection of the distribution of distance values in the image plane, represented by the depth map, onto the three-dimensional space. Then, by calculating the normal vector to a small area having three or more points in the point group as the vertexes, the normal map generating unit 326 can obtain the normal vectors to the subject surface in units of this small area. Calculation techniques using such a principle are widely known in the field of computer vision and libraries such as point cloud library (PCL) have been widely spread, for example.

Then, the normal map generating unit 326 generates a final normal map based on the normal vectors generated from the depth map and the azimuths of the surface acquired from the polarization images. As described above, in the depth map, omission of data is caused in the image plane and errors are included depending on the state of the subject surface and so forth in some cases. Therefore, the azimuths of the subject surface acquired from the polarization images and the normal vectors generated from the depth map are compared to generate a normal map having higher accuracy. For example, normal vectors that obviously depart from the azimuths obtained from the polarization images are excluded from the result and normal vectors to regions involving omission are estimated from the azimuths and are interpolated.

By using the luminance difference between left and right natural light images and the depth map as above, the normal map can be accurately generated although the imaging apparatus that acquires polarization information is only a single side in the stereo camera. The depth map generating unit 228 interpolates the initial data of the depth map by using the normal map generated in this manner to generate a final depth map similarly to the case of FIG. 23. The depth map generating unit 228 may use the polarization images for the detection itself of corresponding points similarly to the case of FIG. 23. The output data generating unit 230 generates and outputs predetermined output data similarly to FIG. 23.

Figure 26:
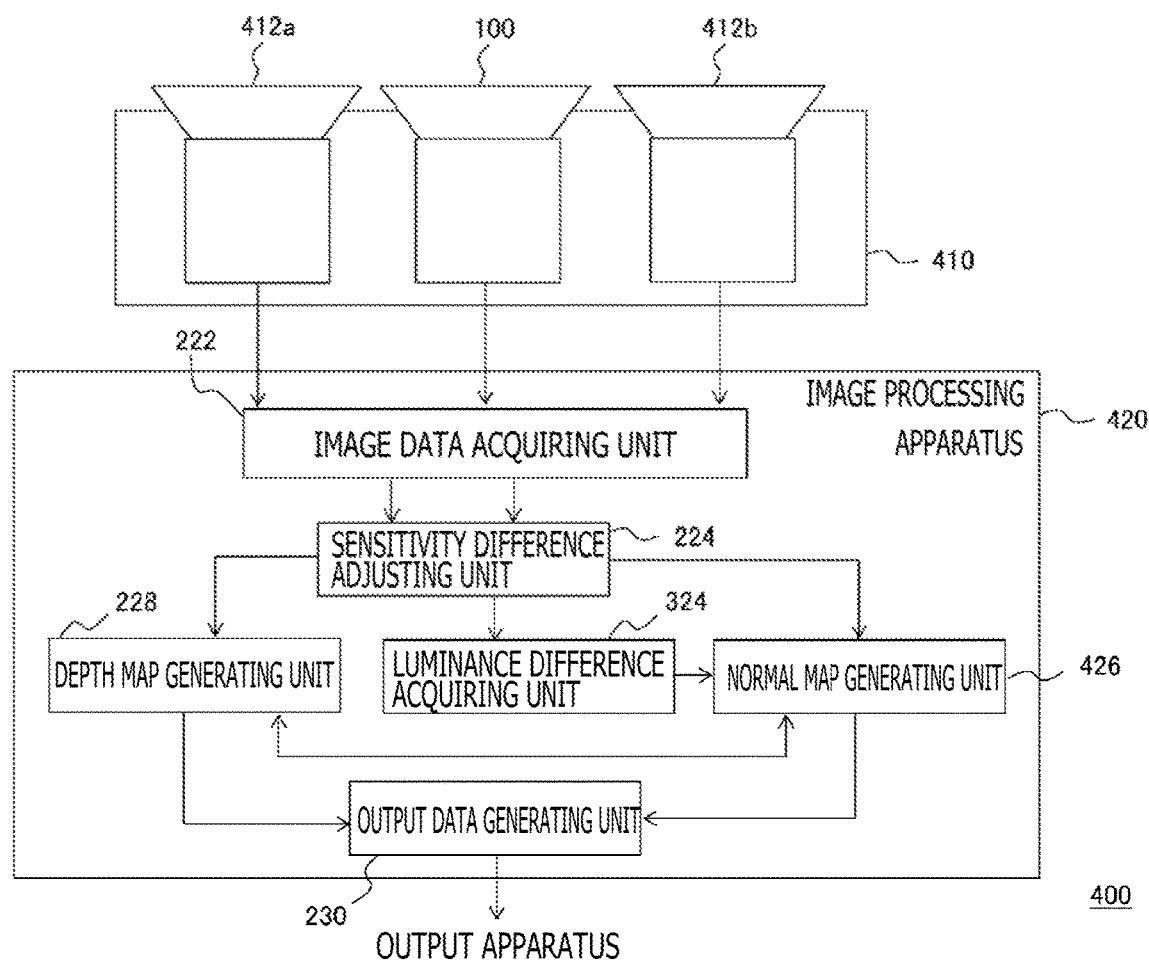
FIG. 26 is a diagram depicting a configuration example of the image processing system of the present embodiment.

FIG. 26 depicts further another example of the configuration of the image processing system of the present embodiment. In this diagram, blocks having the same functions as those depicted in FIG. 24 are given the same numerals and description is omitted as appropriate. An image processing system 400 includes a three-eye camera 410 and an image processing apparatus 420. The three-eye camera 410 is a camera in which an imaging apparatus 412a of a general color image, the imaging apparatus 100 depicted in FIG. 7, and an imaging apparatus 412b of a general color image are disposed on the left, middle, and right to have known intervals.

The image processing apparatus 420 includes the image data acquiring unit 222 that acquires pieces of data of images from the three-eye camera 410, the sensitivity difference adjusting unit 224 that adjusts the sensitivity difference among the acquired pieces of image data of three points of view, the depth map generating unit 228 that generates a depth map, the luminance difference acquiring unit 324 that acquires the luminance difference between left and right natural light images, a normal map generating unit 426 that generates a normal map, and the output data generating unit 230 that generates data that should be output.

The image data acquiring unit 222 acquires data of images from the three-eye camera 410 similarly to the cases of FIGS. 23 and 24. However, in this case, data of left and right color images of natural light from the imaging apparatuses 412a and 412b and data of a luminance image of the natural light and black-and-white polarization images of four channels from the imaging apparatus 100 located at the middle are obtained. The sensitivity difference adjusting unit 224 carries out adjustment to align the output levels of the images of the natural light from three points of view. The depth map generating unit 228 extracts corresponding points from the left and right color images of the natural light acquired from the imaging apparatuses 412a and 412b and calculates distances of the subject from the imaging plane based on the disparity thereof to generate initial data of a depth map.

The luminance difference acquiring unit 324 acquires the luminance difference between corresponding regions based on the disparity between the left and right color images of the natural light calculated by the depth map generating unit 228 similarly to the case of FIG. 24. The normal map generating unit 426 detects regions in which the amplitude of the polarization luminance is larger than a predetermined threshold in the polarization images of four channels from the imaging apparatus 100. It is considered that specular reflection is dominant in a region in which the polarization orientation dependency is large in the polarization image. Then, among the regions detected in this manner, regions whose luminance difference surpasses a predetermined threshold in a luminance difference image generated by the luminance difference acquiring unit 324 are extracted.

Due to this, the region in which specular reflection is dominant can be identified more accurately by using the left and right color images of the natural light from the imaging apparatuses 412a and 412b and the polarization images from the imaging apparatus 100. Furthermore, similarly to the case of FIG. 24, the normal map generating unit 426 approximates such a sine wave of the luminance as to interpolate the polarization orientations of four channels based on the polarization images obtained from the imaging apparatus 100 and thereafter obtains the azimuths of the subject surface by a method suitable for a respective one of the regions according to which of the specular reflection component and the diffuse reflection component is dominant. Moreover, the normal map generating unit 426 generates a final normal map by using normal vectors to the subject surface obtained by using the initial data of the depth map generated by the depth map generating unit 228 and these azimuths.

The depth map generating unit 228 interpolates the initial data of the depth map by using the normal map generated in this manner to generate a final depth map similarly to the case of FIG. 24. Also in this case, the depth map generating unit 228 may use the polarization images for the detection itself of corresponding points. The output data generating unit 230 generates and outputs predetermined output data similarly to FIG. 24. According to such a three-eye camera, the depth map can be generated more accurately due to the imaging apparatuses at both ends having large disparity. In addition, the normal map is created by using the polarization images existing at the middle of the disparity. Thus, the correspondence among the three is easily taken and the accuracy can be further improved.

According to the present embodiment described above, the photoelectric conversion element layers are provided over and under the electrically-conductive wire grid polarizers in the imaging element. The photoelectric conversion element layer of the upper layer includes an organic material having optical transmittivity. In addition, electrodes for voltage application and charge reading also include a material having transmittivity. Due to this, light reflected by the wire grid polarizers also becomes the detection target as well as part of light incident from the upper surface. The polarization components transmitted through the wire grid polarizers are detected by the photoelectric conversion element layer of the lower layer. Thus, as the whole of the imaging element, the incident light can be used without waste and information on the natural light and the polarization component can be acquired with high sensitivity. Furthermore, by controlling the reading rates of signals of both independently, sufficient performance is obtained in view of both the detection sensitivity and the reading speed.

Furthermore, information on the natural light and information on the polarization component can be simultaneously acquired at the same position at the pixel level. Thus, when the shape and position of a subject are acquired by using them, processing for aligning the positions of both is unnecessary. Furthermore, problems relating to the position alignment does not occur even with a subject having poor feature points. Moreover, because plural kinds of images are acquired at the same position, the degree of details and the accuracy of the image to be finally output can be enhanced by using both in a mutually complementary manner. Specifically, it is possible to compensate for a defect of the original detection value and restore a lost high-frequency component in terms of internal processing.

Furthermore, in depth map generation using general stereo images of natural light, a part regarding which corresponding points cannot be extracted and a distance value is not calculated is often generated. However, a detailed depth map can be generated due to acquisition of polarization images of the same position. Specifically, minute recesses and protrusions in an object surface are also obtained as polarization information and thus they can be utilized as feature points. Furthermore, even when distance values obtained by deeming such feature points as corresponding points are discrete, more detailed depth image is obtained in view of the continuity of the surface obtained from a normal map. Moreover, by combining with an imaging apparatus that photographs a general color image, the optimum image processing system can be constructed in view of the required accuracy, the permitted load of processing, the manufacturing cost, and so forth.

The present invention is described above based on the embodiment. It is understood by those skilled in the art that the above-described embodiment is exemplification and various modification examples are possible regarding combinations of the respective constituent elements and the respective processing processes of them and that such modification examples also fall within the range of the present invention.

For example, in the present embodiment, that a luminance image of natural light is acquired by employing an organic photoelectric conversion material that detects light of a wide wavelength band as the first light detecting layer 12 is employed as the basis. On the other hand, by stacking organic photoelectric conversion materials that detect light of a specific wavelength band with the intermediary of electrodes, information on different colors may be acquired from the respective layers to be turned to a color image of natural light. Similarly, by providing the second light detecting layer 16 with a layer-stacked structure of organic photoelectric conversion materials that detect light of a specific wavelength band, polarization color images may be acquired without providing a color filter layer. In this case, information on red, green, and blue is obtained at the same pixel and therefore the step of executing demosaicing processing of the Bayer arrangement becomes unnecessary.

REFERENCE SIGNS LIST

10 Imaging element, 12 First light detecting layer, 14 Wire grid polarizer layer, 16 Second light detecting layer, 28 Imaging element, 36 Upper electrode, 38 Organic photoelectric conversion film, 44 Lower electrode, 48 Polarizer, 54 Photoelectric conversion element, 70 Image sensor, 72 Natural light data acquiring unit, 74 Polarization data acquiring unit, 75 Sensitivity difference adjusting unit, 76 Defect correcting unit, 78 Defect detecting unit, 84 Natural light image generating unit, 86 Polarization image generating unit, 100 Imaging apparatus, 160 Imaging apparatus, 161 Image sensor, 162 Polarization data acquiring unit, 164 Luminance image generating unit, 166 Color image generating unit, 168 Polarization image generating unit

INDUSTRIAL APPLICABILITY

As described above, the present invention can be used for cameras, imaging apparatuses, image processing apparatuses, information processing apparatuses, object recognition apparatuses, image analysis apparatuses, systems including them, and so forth.

The invention claimed is:

1. An imaging element comprising:
a first visible light detecting layer including a photoelectric conversion element having optical transmittivity,
wherein the first visible light detecting layer absorbs and measures 40% of initial incident visible light on the first visible light detecting layer and transmits 60% of the initial incident visible light through the first visible light detecting layer;
a polarizer layer existing at a lower level relative to the first visible light detecting layer and includes a polarizer having reflective members formed in a stripe manner,
wherein the polarizer layer is divided into a plurality of grid areas with each grid area comprising four polarizers,
wherein in each grid area polarizers that exist on a diagonal are orthogonal on a principal axis angle and polarizers adjacent to each other have a difference of 45° on the principal axis angle,
wherein the reflective members reflect 50% of the visible light passed through the first visible light detecting layer back towards the first visible light detecting layer,
wherein the reflected visible light reflected by the reflecting members is detected and measured by the first visible light detecting layer; and
a second visible light detecting layer that exists at a lower level relative to the polarizer layer and includes a photoelectric conversion element,
wherein the second visible light detecting layer absorbs and measures polarized visible light passed through the polarized layer.

2. The imaging element according to claim 1, wherein
the first visible light detecting layer includes an organic photoelectric conversion film that photoelectrically converts visible light of a predetermined wavelength band, and
the second visible light detecting layer includes a semiconductor element.

3. The imaging element according to claim 1, wherein
the polarizer layer has an arrangement of a plurality of polarizers different in a principal axis angle, and
the first visible light detecting layer includes electrodes to read out a charge generated by converting incident visible light on the imaging element and reflected visible light from the reflective members of the polarizers in units of the polarizer with a respective one of the principal axis angles or in units smaller than it.

4. The imaging element according to claim 3, wherein the second visible light detecting layer includes mechanisms to read out a charge generated by converting transmitted visible light from the polarizers in units of the polarizer with the respective one of the principal axis angles or in units smaller than it.

5. The imaging element according to claim 1, wherein the first light detecting layer has an element structure including one organic photoelectric conversion film that photoelectrically converts light of a predetermined wavelength band including a wavelength band corresponding to a plurality of colors and electrodes that sandwich it and have transmittivity.

6. The imaging element according to claim 5, wherein the organic photoelectric conversion film is in contact with lower electrodes to read out a charge generated by photoelectric conversion on the lower electrodes, and has recessed shapes in contact with side surfaces and upper surfaces of an insulating film that insulates the lower electrodes adjacent to each other between them.

7. An imaging element comprising:
a first visible light detecting layer including a photoelectric conversion element,
wherein the first visible light detecting layer absorbs and measured 40% of initial incident visible light with wavelengths between 380 nm and 750 nm on the first visible light detecting layer and transmits 60% of the initial incident visible light through the visible light detecting layer;
a wire grid polarizer layer existing at a lower level relative to the first visible light detecting layer and includes a wire grid polarizer having reflective members formed in a stripe manner,
wherein the wire grid polarizer layer is divided into a plurality of grid areas with each grid area comprising four polarizers,
wherein in each grid area polarizers that exist on a diagonal are orthogonal on a principal axis angle and polarizers adjacent to each other have a difference of 45° on the principal axis angle,
wherein the wire grid polarizer layer reflects 30% of the visible light passed through the first visible light detecting layer back towards the first visible light detecting layer,
wherein the visible light reflected by the wire grid polarizer layer has a polarization direction parallel to a line direction of the reflective members,
wherein the polarized and reflected visible light reflected by the wire grid polarizer layer is detected and measured by the first visible light detecting layer, and
wherein visible light transmitted through the wire grid polarizer layer has a polarization direction perpendicular to the line direction of the reflective members; and
a second visible light detecting layer that exists at a lower level relative to the wire grid polarizer layer and includes a photoelectric conversion element,
wherein the second visible light detecting layer absorbs and measures polarized visible light passed through the wire grid polarizer layer.

8. An imaging element comprising:
a first visible light detecting layer including a photoelectric conversion element having optical transmittivity;
a polarizer layer that exists at a lower level relative to the first visible light detecting layer and includes a polarizer having reflective members formed in a stripe manner,
wherein the wire grid polarizer layer is divided into a plurality of grid areas with each grid area comprising four polarizers, and
wherein in each grid area polarizers that exist on a diagonal are orthogonal on a principal axis angle and polarizers adjacent to each other have a difference of 45° on the principal axis angle;
a second visible light detecting layer that exists at a lower level relative to the polarizer layer and includes a photoelectric conversion element,
wherein incident visible light reflected by the reflective members is detected by the first visible light detecting layer; and
an inorganic isolating film arranged in a lattice above the second visible light detecting layer having a well shape having a recess with upper electrodes of the first visible light detecting layers in an opposed region of the recess,
wherein the inorganic isolating film suppresses visible light from a lateral direction of the recess on the second visible light detecting layer.

* * * * *